US010636500B1

(12) United States Patent
Chen et al.

(10) Patent No.: US 10,636,500 B1
(45) Date of Patent: Apr. 28, 2020

(54) REDUCING READ DISTURB IN TWO-TIER MEMORY DEVICE BY MODIFYING RAMP UP RATE OF WORD LINE VOLTAGES DURING CHANNEL DISCHARGE

(71) Applicant: SanDisk Technologies LLC, Addison, TX (US)

(72) Inventors: Hong-Yan Chen, San Jose, CA (US); Wei Zhao, Fremont, CA (US); Yingda Dong, Los Altos, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/227,635

(22) Filed: Dec. 20, 2018

(51) Int. Cl.
*G11C 16/34* (2006.01)
*G11C 16/04* (2006.01)
(Continued)

(52) U.S. Cl.
CPC ...... *G11C 16/3427* (2013.01); *G11C 11/5642* (2013.01); *G11C 11/5671* (2013.01); *G11C 16/0483* (2013.01); *G11C 16/26* (2013.01); *G11C 16/32* (2013.01); *H01L 27/1157* (2013.01); *H01L 27/11524* (2013.01); *H01L 27/11556* (2013.01); *H01L 27/11582* (2013.01)

(58) Field of Classification Search
CPC . G11C 16/3427; G11C 16/32; G11C 16/0483; G11C 16/26; G11C 11/5671; G11C 11/5642; H01L 27/1157; H01L 27/11582; H01L 27/11524; H01L 27/11556
See application file for complete search history.

(56) References Cited

U.S. PATENT DOCUMENTS 9,286,994 B1 3/2016 Chen et al.
9,361,993 B1 6/2016 Chen et al.
(Continued)

FOREIGN PATENT DOCUMENTS

EP 3113186 B1 11/2018
KR 10-2018-0021964 A 3/2018

OTHER PUBLICATIONS

International Search Report & the Written Opinion of the International Searching Authority dated Dec. 17, 2019, International Application No. PCT/US2019/047971.
(Continued)

*Primary Examiner* — Sultana Begum
(74) *Attorney, Agent, or Firm* — Vierra Magen Marcus LLP

(57) ABSTRACT

Techniques for reducing read disturb of memory cells in a two-tier stack having a lower tier and an upper tier separated by an interface. In a read operation, the channels of NAND strings are discharged before reading the selected memory cells. The discharge involves ramping up the word line voltages and grounding the ends of the NAND strings. To increase the discharge, a ramp up rate may be greater for the selected word line and for dummy memory cells adjacent to the interface, compared to the ramp up rate for the unselected word lines. In an option, the greater ramp up rate is also used for the word lines between the selected word line and the interface. In another option, the greater ramp up rate is used for the word lines in the same tier as the selected word line.

20 Claims, 23 Drawing Sheets

(51) Int. Cl.
  *G11C 11/56* (2006.01)
  *G11C 16/26* (2006.01)
  *G11C 16/32* (2006.01)
  *H01L 27/11582* (2017.01)
  *H01L 27/11524* (2017.01)
  *H01L 27/1157* (2017.01)
  *H01L 27/11556* (2017.01)

(56) References Cited

U.S. PATENT DOCUMENTS

| | | |
|---|---|---|
| 9,466,369 B1 | 10/2016 | Pang et al. |
| 9,530,506 B2 | 12/2016 | Rabkin et al. |
| 9,553,506 B1 | 1/2017 | Huynh et al. |
| 9,620,233 B1 | 4/2017 | Dong et al. |
| 9,640,273 B1 | 5/2017 | Chen et al. |
| 9,653,126 B2 | 5/2017 | Nguyen et al. |
| 9,761,320 B1 | 9/2017 | Chen et al. |
| 2008/0239830 A1* | 10/2008 | Lee .................... G11C 16/0483 365/185.29 |
| 2012/0307561 A1 | 12/2012 | Joo et al. |
| 2014/0269093 A1* | 9/2014 | Maejima ............. G11C 11/5642 365/185.21 |
| 2014/0286099 A1* | 9/2014 | Shirakawa ............. G11C 16/26 365/185.12 |
| 2016/0049192 A1* | 2/2016 | Lee .................... G11C 16/3427 365/185.03 |
| 2016/0148691 A1 | 5/2016 | Rabkin et al. |
| 2016/0217865 A1 | 7/2016 | Chen et al. |

OTHER PUBLICATIONS

English Abstract of KR Publication No. KR10-2018-0021964 published on Mar. 6, 2018.
U.S. Appl. No. 15/879,084, filed Jan. 24, 2018 by Chen et al.
U.S. Appl. No. 16/015,612, filed Jun. 22, 2018 by Chen et al.
U.S. Appl. No. 15/814,772, filed Nov. 16, 2017 by Chen et al.

* cited by examiner

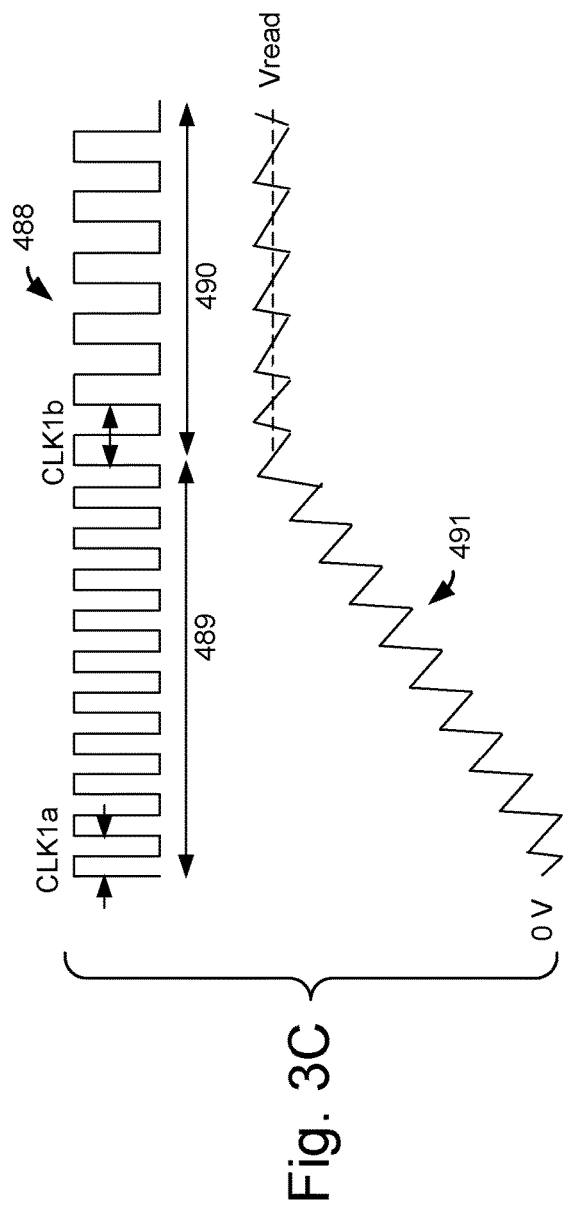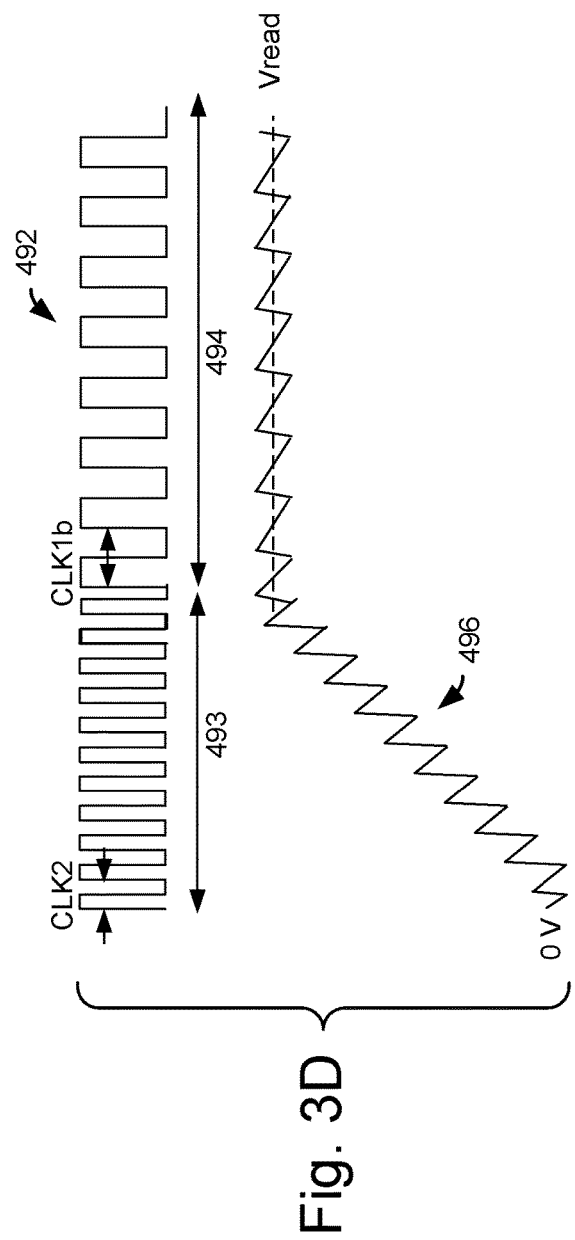

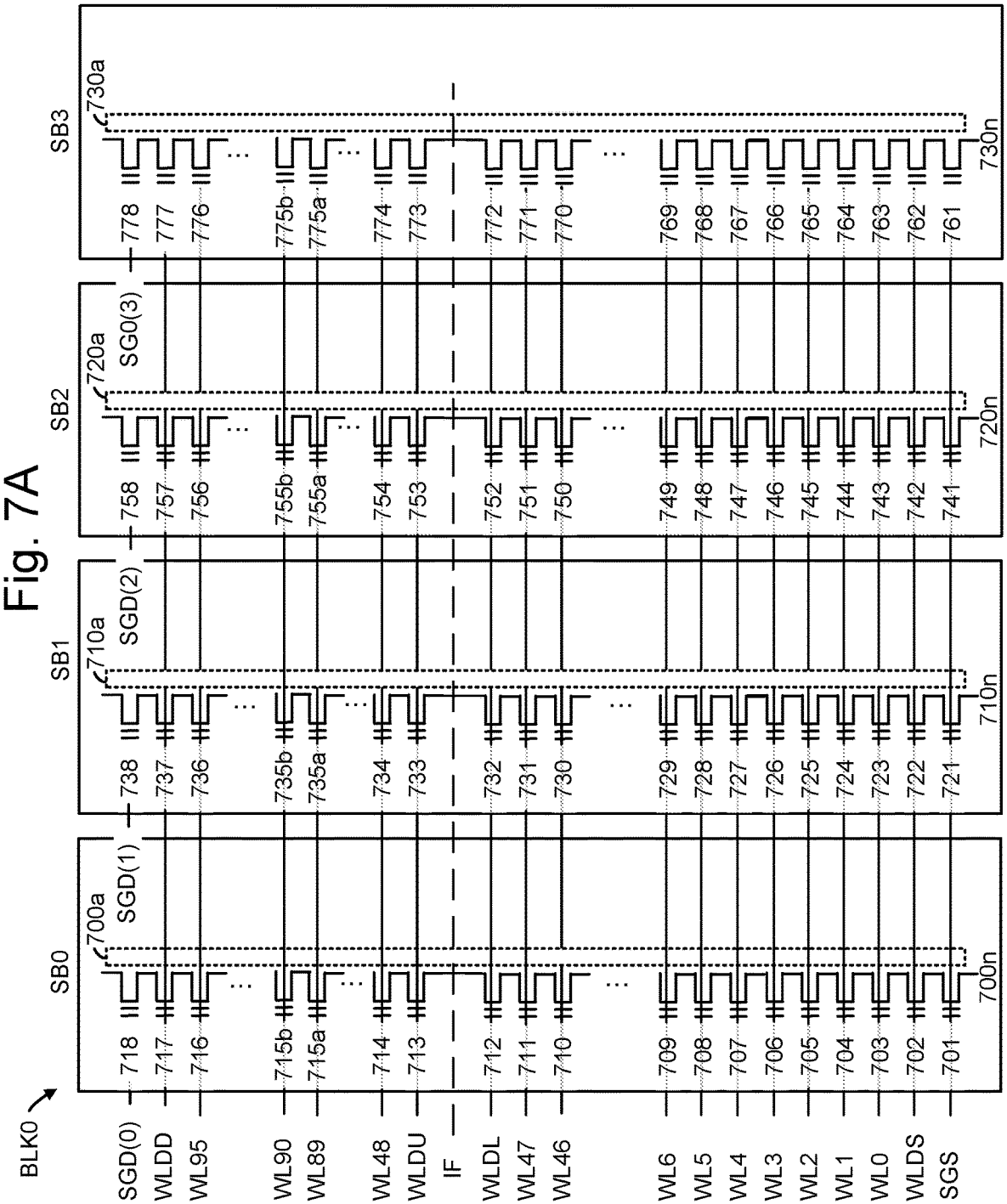
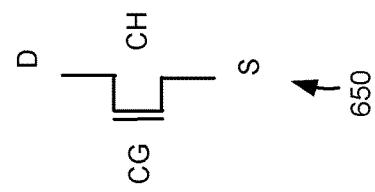

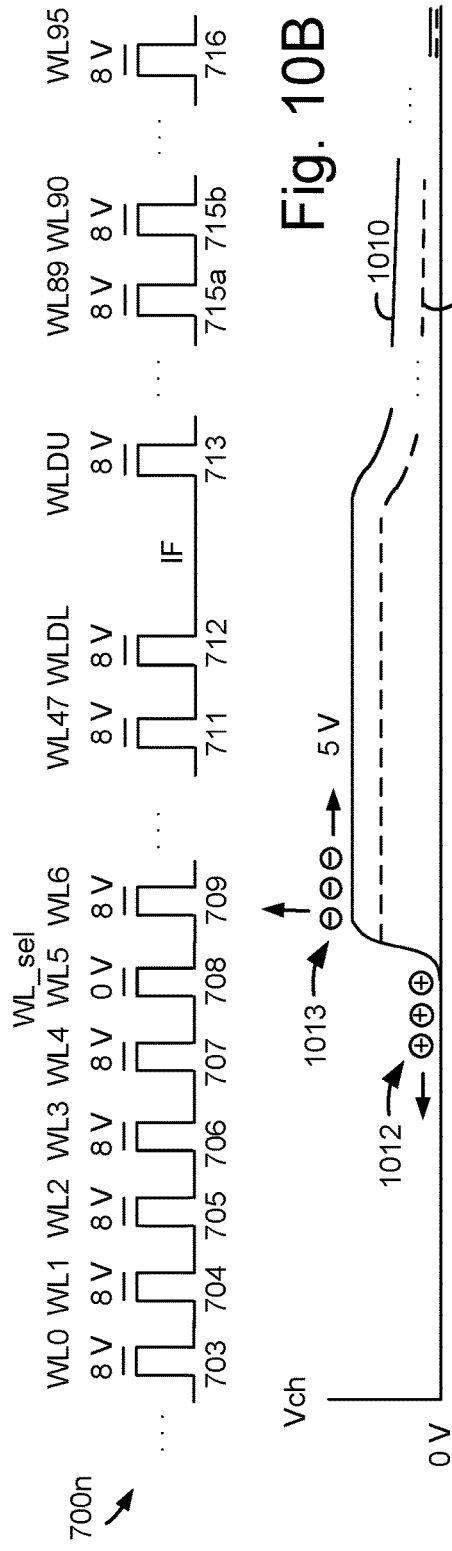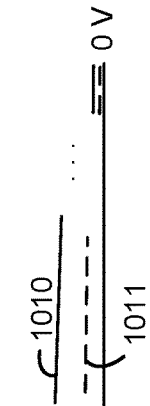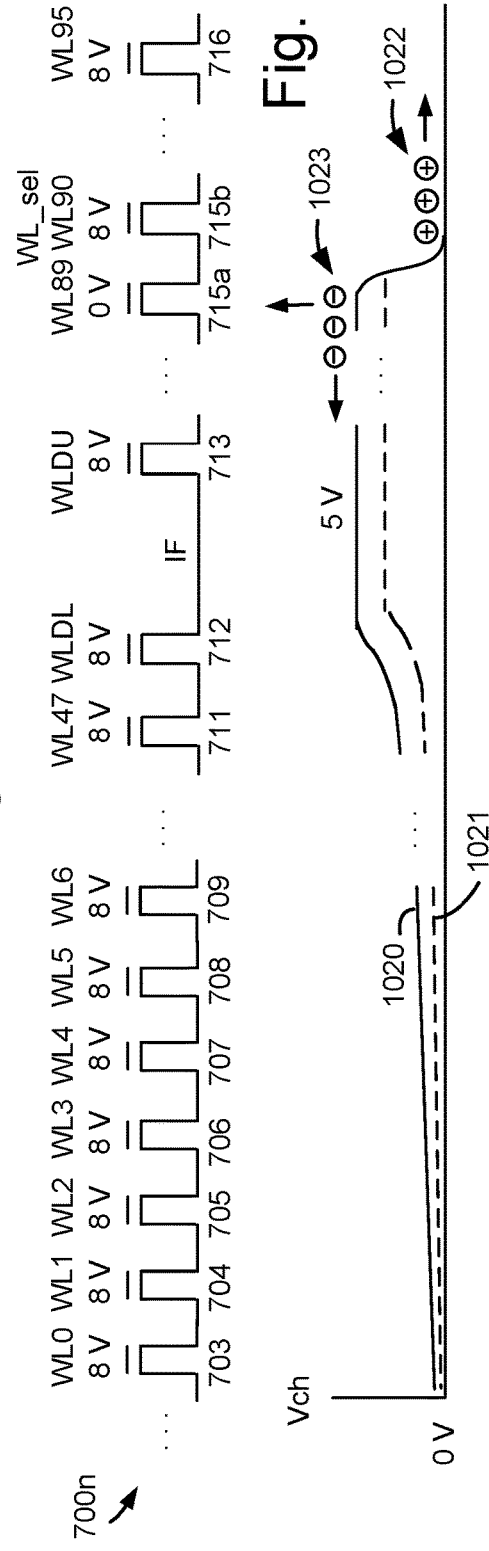

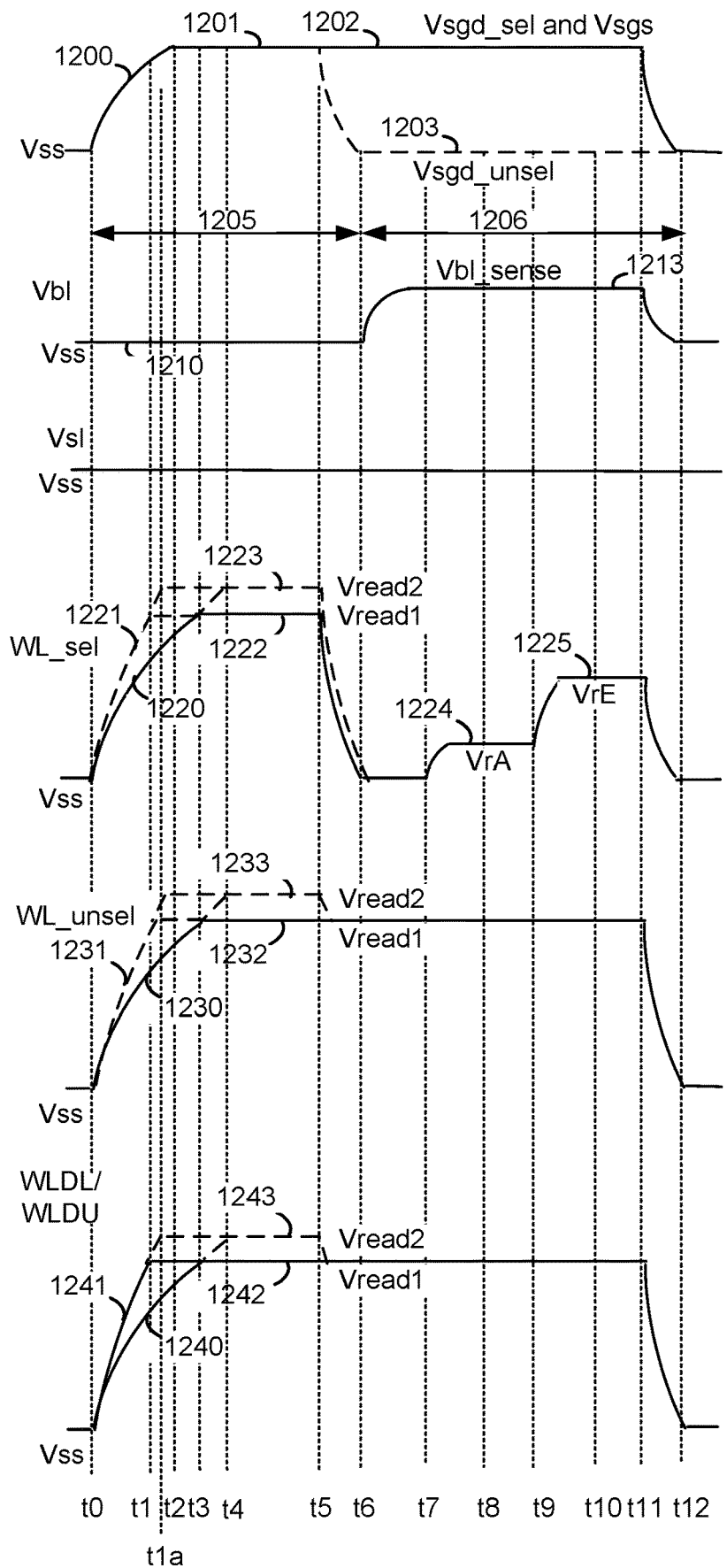

Fig. 12G

Example options for word line voltages in discharge phase of read operation

1. WL_sel=fast, WLDL/WLDU=fast, WL_unsel=normal

2. WL_sel=fast, WLDL/WLDU=fast, WL_unsel between WL_sel and IF=fast, remaining WL_unsel=normal 3. WL_sel=fast, WLDL/WLDU=fast, WL_unsel in same tier as WL_sel=fast, WL_unsel in different tier than WL_sel=normal

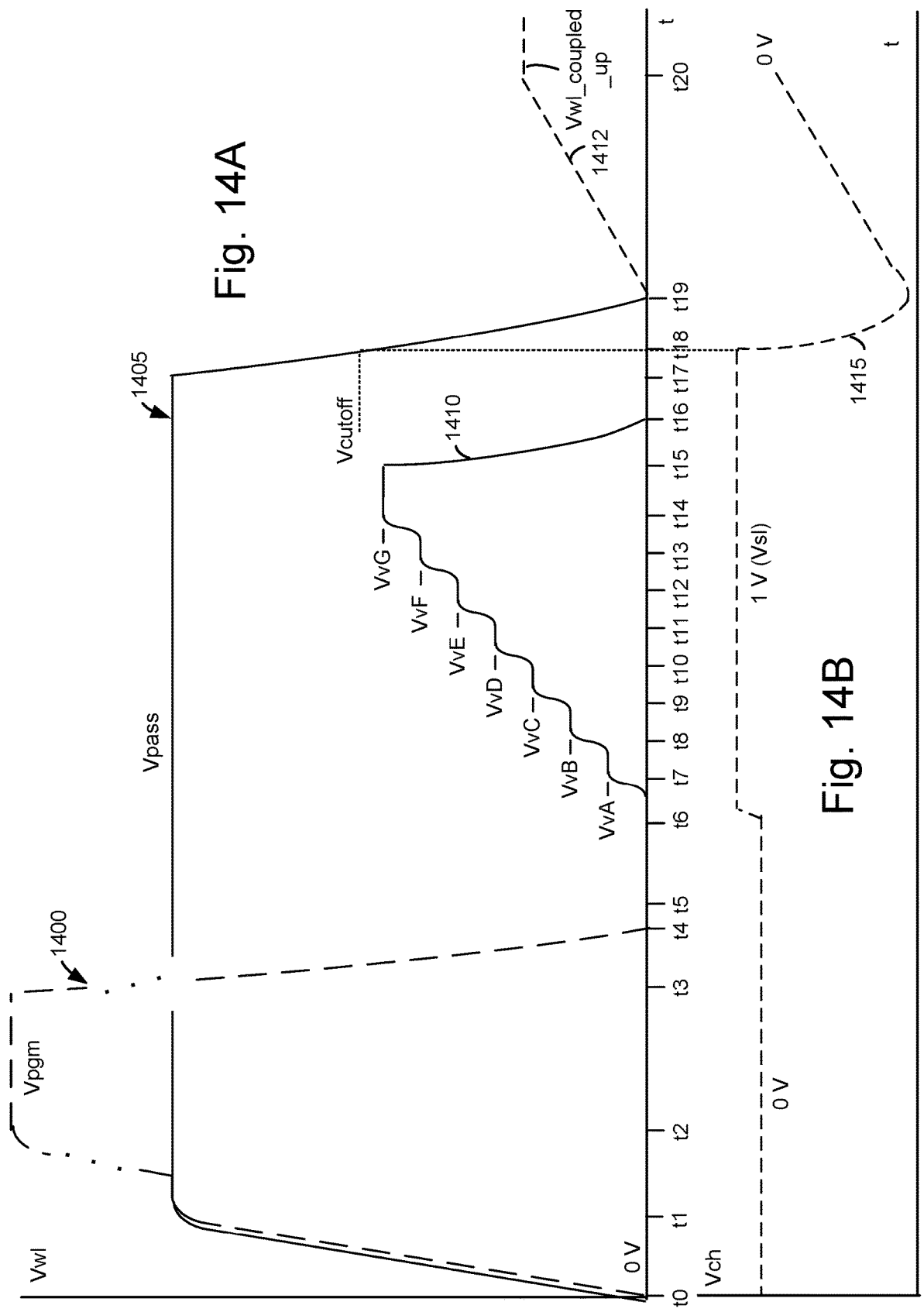

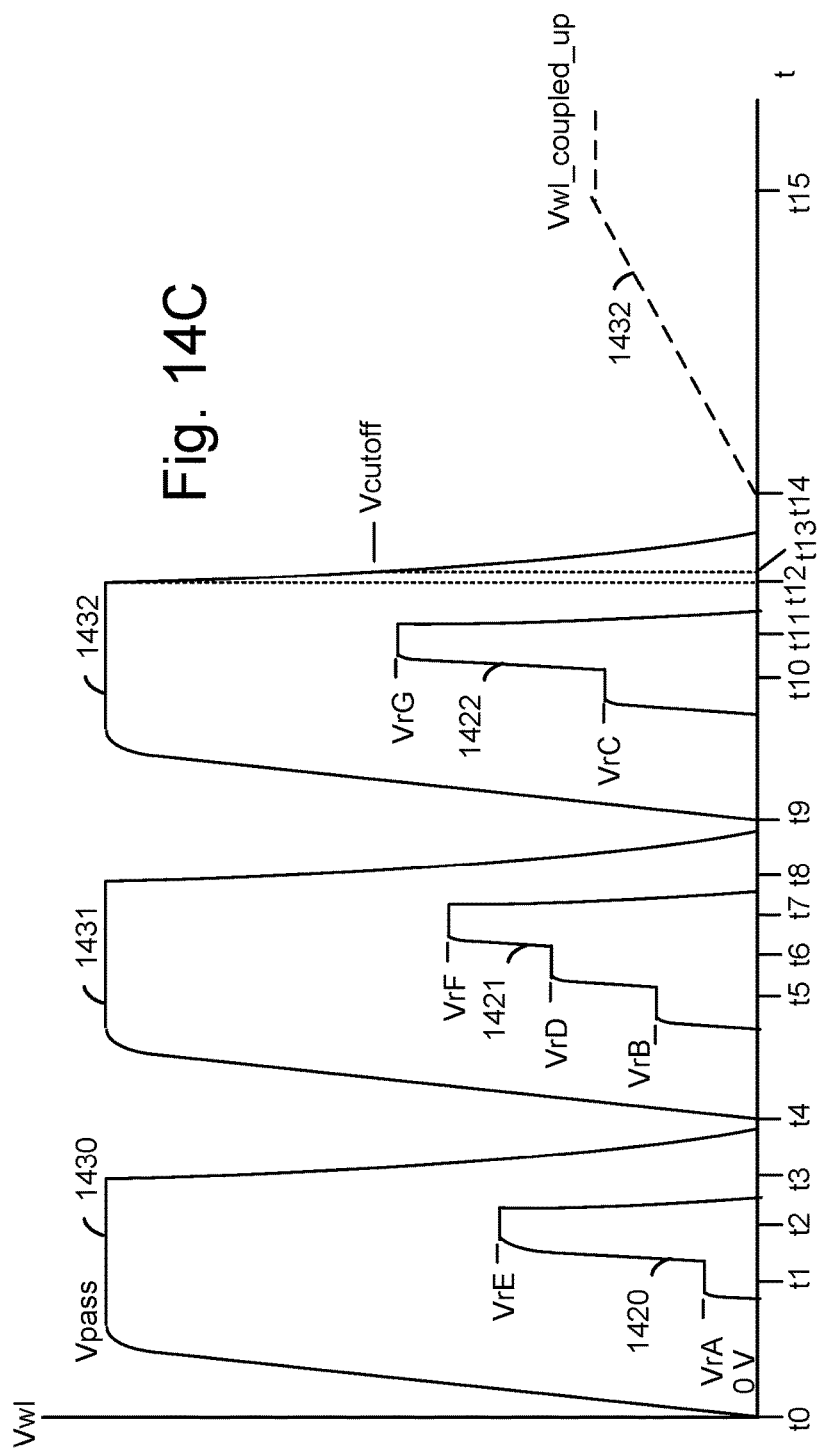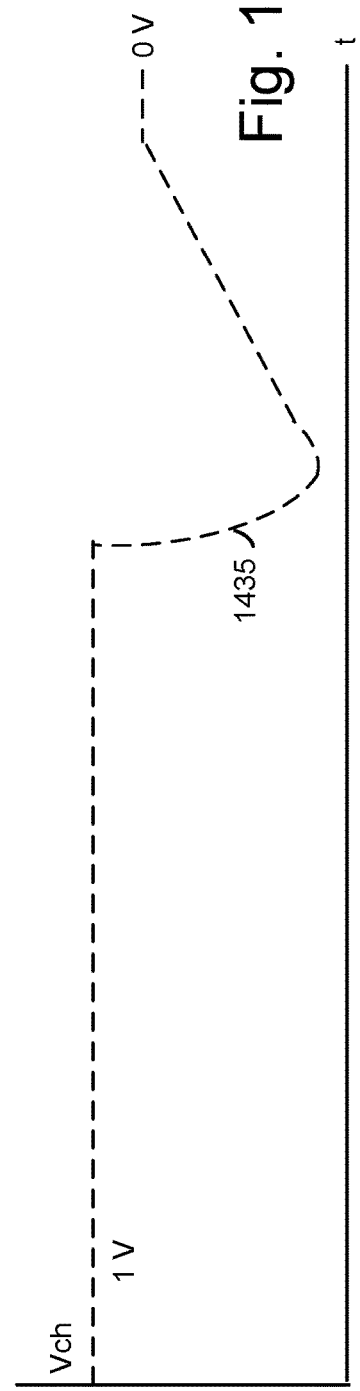

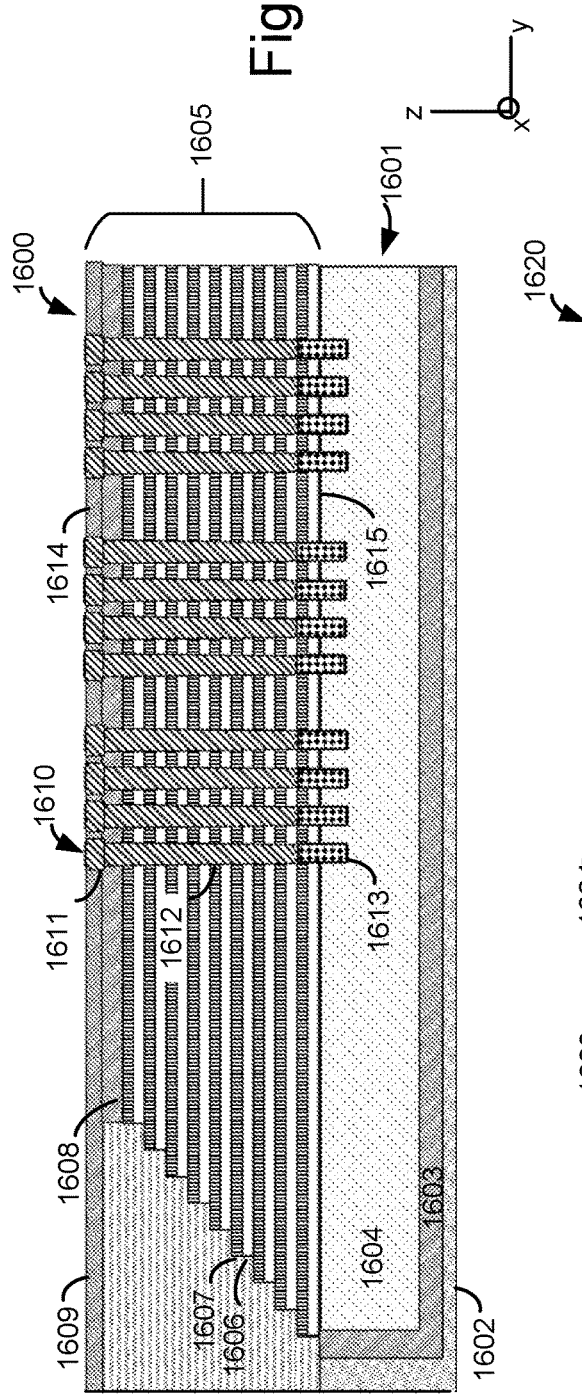
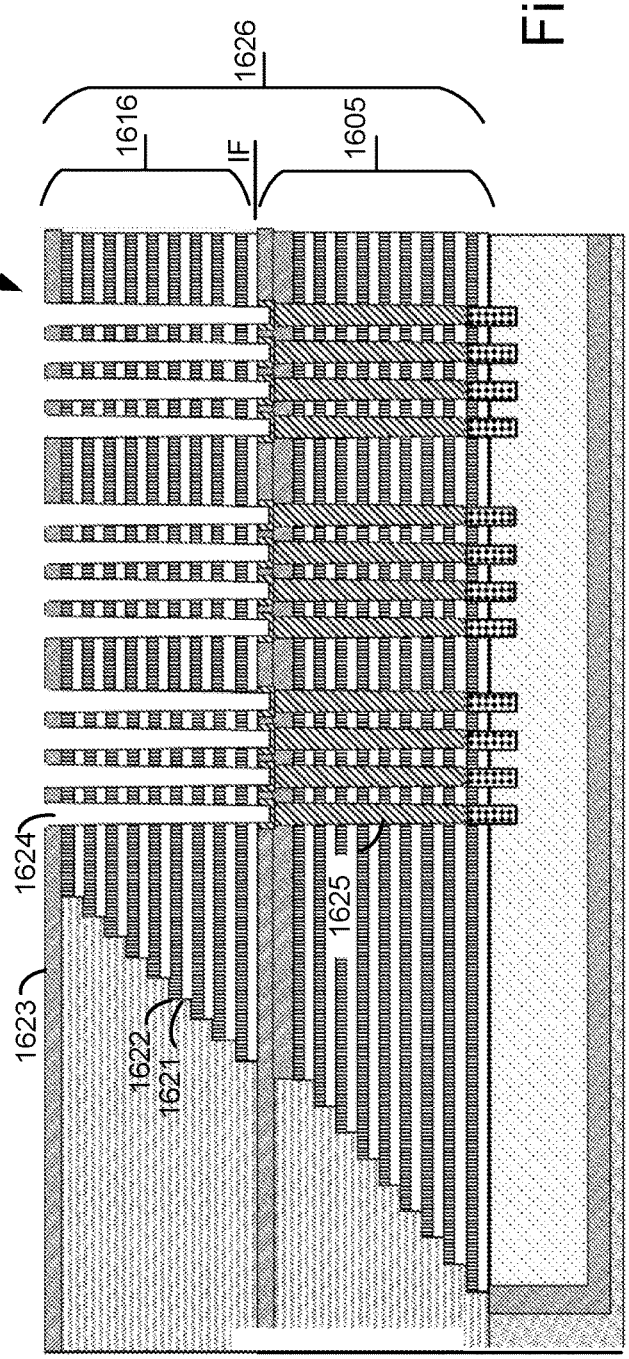

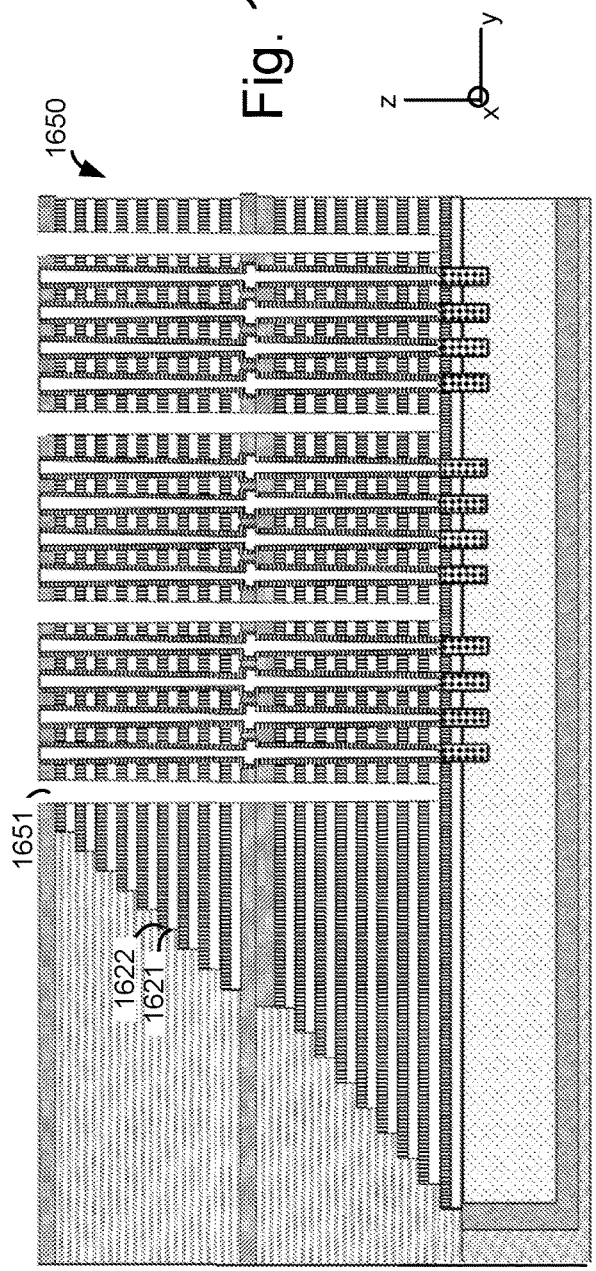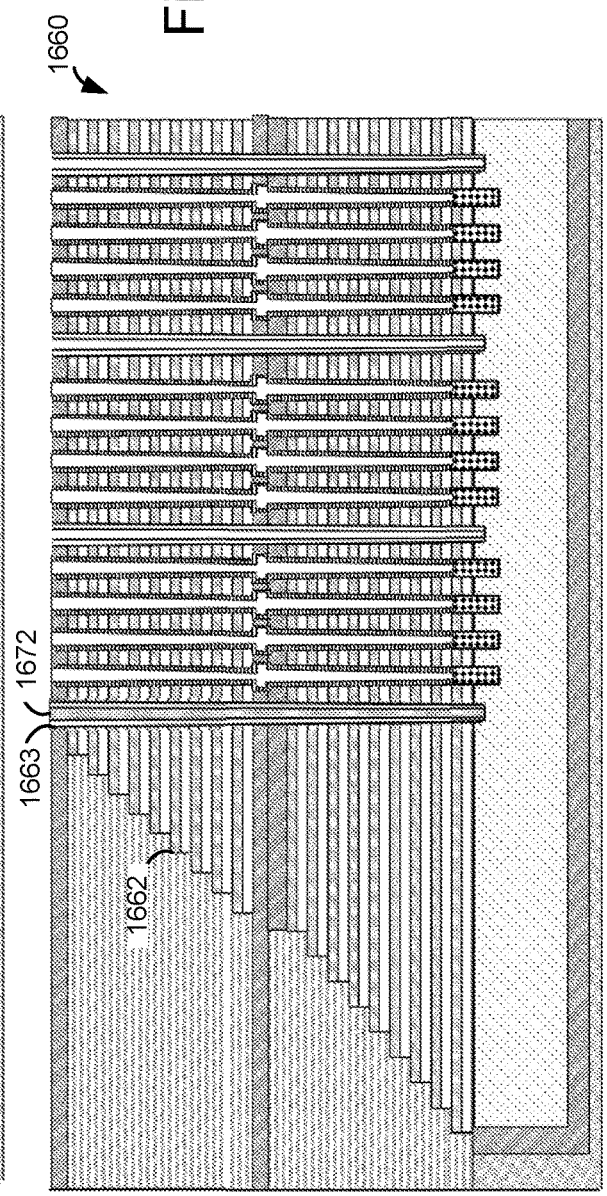

REDUCING READ DISTURB IN TWO-TIER MEMORY DEVICE BY MODIFYING RAMP UP RATE OF WORD LINE VOLTAGES DURING CHANNEL DISCHARGE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 3C depicts an example clock signal 488 and output voltage 491 of the charge pump of FIG. 3B where a normal ramp up rate is used.

FIG. 3D depicts an example clock signal 492 and output voltage 496 of the charge pump of FIG. 3B where a fast ramp up rate is used.

FIG. 7A depicts an example view of NAND strings in sub-blocks in a 3D configuration which is consistent with the two-tier stack of FIG. 5.

FIG. 7B depicts an example transistor 650 which represents any of the memory cells or select gate transistors of FIG. 7A.

FIG. 10A depicts the NAND string 700n of FIG. 7A, where an example lower-tier word line, WL5, is selected for reading.

FIG. 10B depicts two examples of channel voltages in the NAND string of FIG. 10A.

FIG. 10C depicts the NAND string 700n of FIG. 7A, where an example upper-tier word line, WL90, is selected for reading.

FIG. 10D depicts two examples of channel voltages in the NAND string of FIG. 10C.

FIG. 12A depicts example voltage signals applied to select gate transistors in a read operation consistent with FIG. 11.

FIG. 12B depicts an example voltage signal applied to a selected bit line in a read operation consistent with FIG. 11.

FIG. 12C depicts an example voltage signal applied to a source line in a read operation consistent with FIG. 11.

FIG. 12D depicts example voltage signals applied to a selected word line in a read operation consistent with FIG. 11.

FIG. 12E depicts example voltage signals applied to unselected data word lines in a read operation consistent with FIG. 11.

FIG. 12F depicts example voltage signals applied to dummy word lines in a read operation consistent with FIG. 11.

FIG. 12G depicts three example options for word line voltages in the discharge phase of a read operation, consistent with FIG. 11 and FIG. 12A-12F.

FIG. 14A depicts a plot of example waveforms in a program operation, showing coupling up of a word line voltage.

FIG. 14B depicts a plot of a channel voltage (Vch) corresponding to FIG. 14A.

FIG. 14C depicts a plot of example waveforms in a read operation, showing coupling up of a word line voltage.

FIG. 14D depicts a plot of a channel voltage (Vch) corresponding to FIG. 14C.

FIG. 16A depicts a semiconductor structure in a configuration which is consistent with steps 1500 and 1501 of FIG. 15.

FIG. 16B depicts a semiconductor structure in a configuration which is consistent with steps 1502 and 1503 of FIG. 15.

FIG. 16E depicts a semiconductor structure in a configuration which is consistent with step 1506 of FIG. 15.

FIG. 16F depicts a semiconductor structure in a configuration which is consistent with steps 1507 and 1508 of FIG. 15.

DETAILED DESCRIPTION

Figure 1:
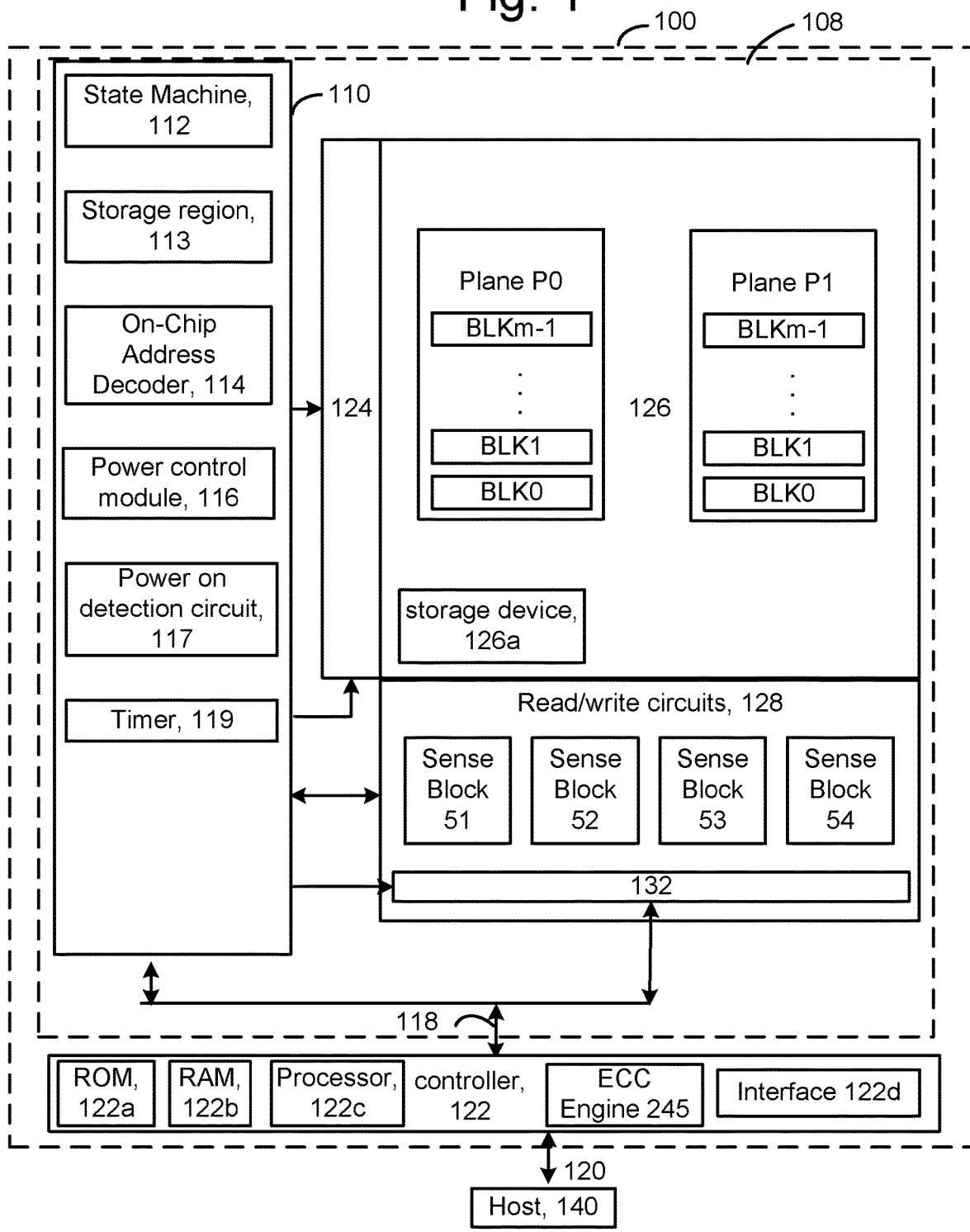
FIG. 1 is a block diagram of an example memory device.

Apparatuses and techniques are described for reducing read disturb in a memory device.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is programmed before programming a next word line. For example, a first word line, WL0, is programmed, then a second word line, WL1, is programmed and so forth until the last word line in the block is programmed. A program operation may use a set of increasing program voltages which are applied to the word line in respective program loops or program-verify iterations.

Verify tests may be performed after each program voltage to determine whether the memory cells have completed programming. A verify test can involve applying a control gate voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state and three higher data states referred to as the A, B and C data states. In a three-bit per cell memory device, there are eight data states including the erased state and seven higher data states referred to as the A-G data states (see FIG. 9). In a four-bit per cell memory device, there are sixteen data states including the erased state (S0) and fifteen higher data states (S0-S15).

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells. In one approach, a read operation occurs in a selected sub-block.

In some 3D memory structures, the memory cells are arranged in vertical NAND strings (or other sets of connected memory cells) in a stack, where the stack comprises alternating conductive and dielectric layers. In this structure, the conductive layers act as word lines which are connected to the memory cells. Further, the memory cells may be formed by annular layers of blocking oxide, charge-trapping material, tunnel oxide and channel polysilicon which extend in the stack. The layers may be arranged concentrically. Each NAND string may have the shape of a pillar which intersects with the word lines to form the memory cells. Due to a desire to increase the height of the stack to allow for more layers and more memory cells in each NAND string, it becomes more difficult to etch low aspect ratio memory holes in which the NAND strings are formed. One approach is to form the stack and memory holes in two (or more) tiers. For example, see FIG. 16G where a stack 1626 comprises an upper tier 1616 formed on a lower tier 1605. The memory hole is etched separately in each tier so that a low aspect ratio can be achieved. The dielectric layer or region at the interface (IF) between the tiers is thicker than the other dielectric layers.

However, read disturb can occur due to unpredictable channel voltages. For example, after a sensing operation, word line voltages can be coupled up and this leads to coupling up of the channel voltages. The channel voltages decay over time if no further operation is performed. See FIG. 14A-14D. The channel voltages can cause read disturbs as discussed in connection with FIG. 10A-10D. A solution is to discharge the channels before the reading occurs by ramping up the voltages of the word lines to provide the memory cells in a conductive state, while connecting a grounding voltage or other low voltage to the drain and source ends of the NAND strings. This allows electrons to enter the channel, thereby discharging the channel by lowering its voltage.

Although, in a multi-tier stack, it is difficult for the electrons to move through the interface due to a reduced conductivity in the interface, between the tiers. The interface is relatively thick and relies on a fringing electric field to turn on the associated channel region. As a result, the discharge of the NAND string channel can be limited, resulting in voltage gradients in the channels which cause read disturb, as discussed in connection with FIG. 10A-10D.

Techniques provided herein address the above and other issues. In one aspect, the channels of NAND strings are more efficiently discharged within a given discharge period before reading selected memory cells. The discharge involves ramping up the word line voltages and grounding the ends of the NAND strings. To increase the discharge, a ramp up rate may be greater for the selected word line and for dummy memory cells adjacent to the interface, compared to the ramp up rate for the unselected word lines. In one option, the greater ramp up rate is also used for the word lines between the selected word line and the interface. In another option, the greater ramp up rate is used for the word lines in the same tier as the selected word line. By providing a greater ramp up rate for some of the word lines, the channel discharging can be increased within a given discharge period while minimizing an additional power consumption of the word line voltage drivers.

In another aspect, a greater peak magnitude of the word line voltage can be provided for some word lines during the channel discharge.

In another aspect, the ramp up rate and/or the peak magnitude of the word line voltage can be set based on a time since a last sensing operation, where this time is correlated with an amount of decay in the channel voltage since the last sensing operation.

In another aspect, a severity of a read disturb countermeasure is set based on a time since a last sensing operation. A more severe read disturb countermeasure can be used when the time is smaller.

These and other features are discussed further below.

FIG. 1 is a block diagram of an example memory device. The memory device 100, such as a non-volatile storage system, may include one or more memory die 108, also referred to as a chip or integrated circuit. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. In one embodiment, the memory structure comprise blocks of memory cells arranged in one or more planes. For example, blocks BLK0-BLKm-1 are arranged in each of planes P0 and P1. A plane may be an area of a substrate with a diffusion layer (such as the well region 433 in FIG. 3A) which is common to each block in the plane, in one approach. The blocks in a plane typically share a common set of bit lines.

The read/write circuits 128 include multiple sense blocks 51-54 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via a path 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a storage region 113, an on-chip address decoder 114, a power control module 116 (power control circuit), a power on detection circuit 117 and a timer 119. The state machine 112 provides chip-level control of memory operations. The storage region 113 may be provided for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach. The power on detection circuit 117 may be used to detect when the memory device has been powered on. This circuit may comprise an event handler which may be a software or firmware routine, or a routine implemented in hardware. The timer 119 may be used to determine a time which has elapsed since a last sensing operation, such as a verify operation during programming or a read operation. The timer may increment based on a clock signal used in the memory device.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51-54, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

Figure 11:
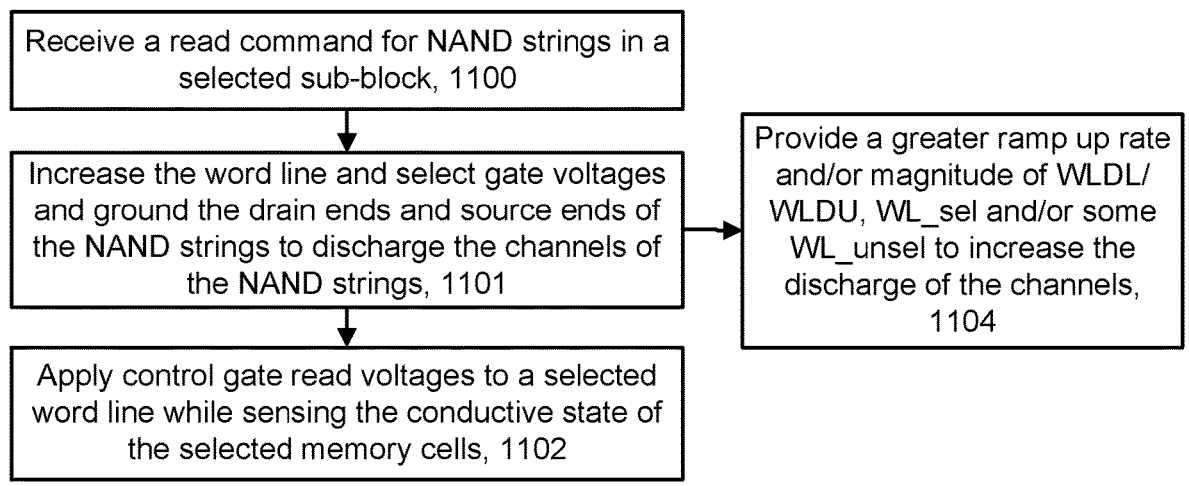
FIG. 11 depicts a flowchart of an example read operation which reduces read disturb, consistent with the examples of FIG. 10A-10D.

The controller 122 or control circuitry 110 can be configured with hardware, firmware and/or software for implementing the processes described herein, including the processes of the flowchart of FIG. 11.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes.

Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
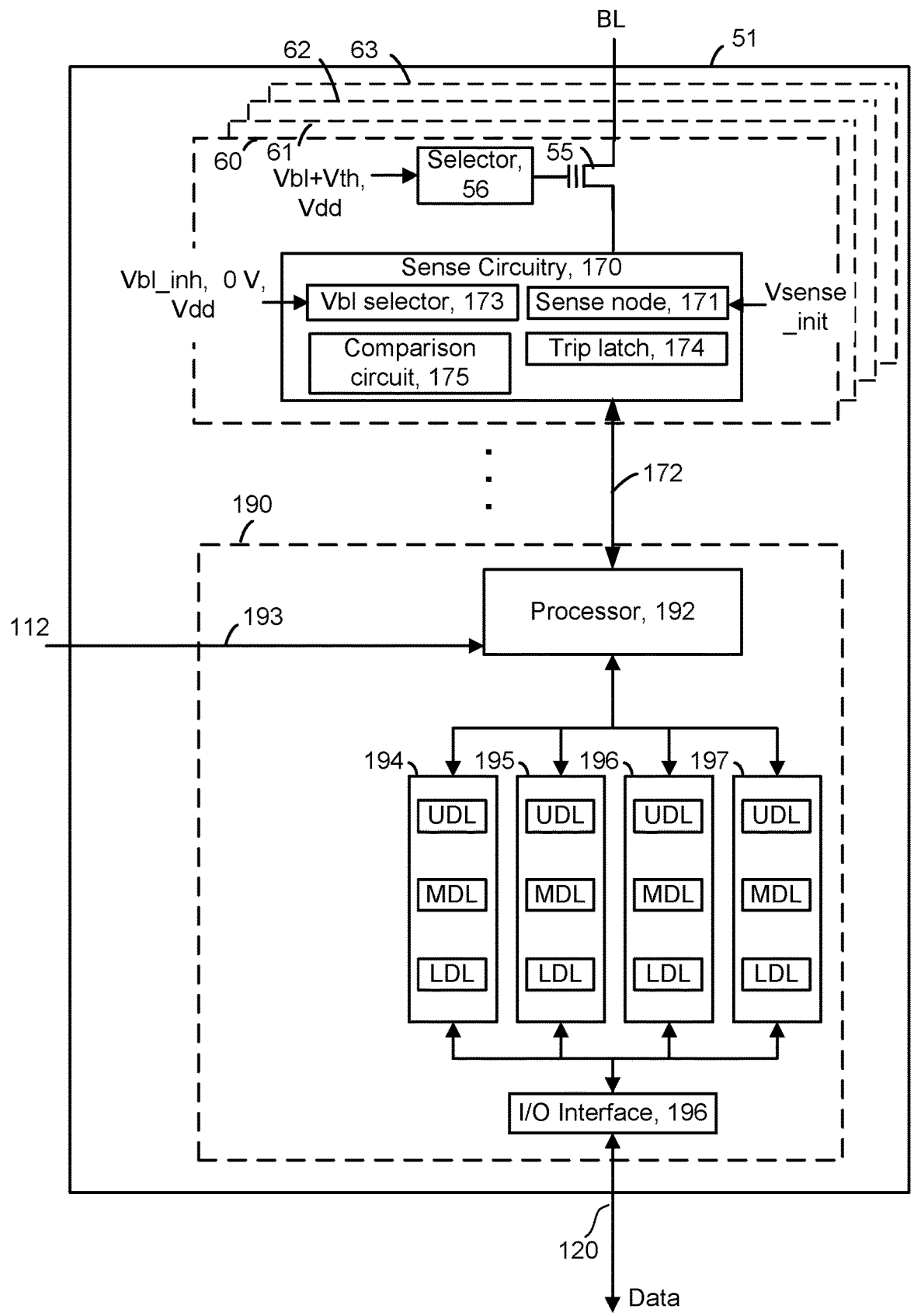
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3A:
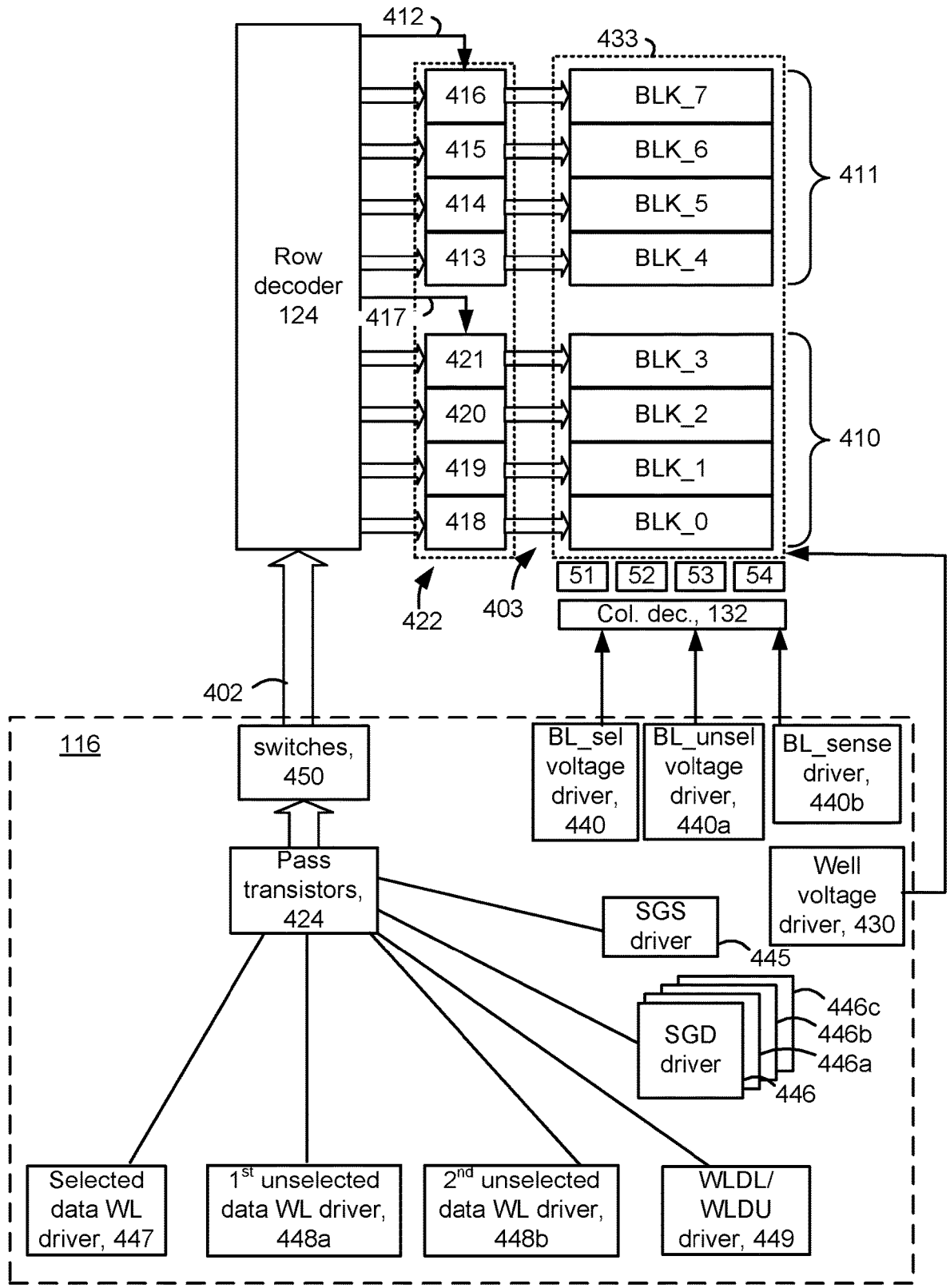
FIG. 3A depicts an example implementation of the power control module 116 of FIG. 1.

FIG. 3A depicts an example implementation of the power control module 116 of FIG. 1. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The voltage drivers can also include first and second drivers 448a and 448b, respectively, for unselected data word lines. These can be remaining, unselected word lines other than the selected word line. As depicted below, e.g., in connection with FIG. 12A-12F, these drivers can be used to provide different ramp up rates and/or peak magnitude for word line voltages when discharging the NAND string channels in a read operation. For example, the first and second drivers 448a and 448b could be used to provide normal and fast (greater than normal) ramp up rates, respectively. The first and second drivers 448a and 448b could be used to provide normal and greater than normal peak magnitudes, respectively. It is possible to provide other voltage drivers for the unselected word lines as well to provide additional ramp up rates and/or peak magnitudes during the channel discharging. Additional voltage drivers can be provided as needed based on the number of different voltage signals.

The voltage drivers can also include a WLDL/WLDU word line driver 449 which provides voltages on a lower dummy interface word line WLDL and an upper dummy interface word line WLDU. See FIG. 5. WLDU is adjacent to and above an interface of a multi-tier stack, and WLDL is adjacent to and below the interface. Both interface dummy word lines are driven together, in one approach. Separate drivers could also be provided for each interface dummy word line.

The voltage drivers can also include separate SGD drivers for each sub-block in a block. For example, in BLK0 as depicted in FIG. 7A, SGD drivers 446, 446a, 446b and 446c can be provided for SGD(0)-SGD(3), respectively, in SB0-SB3, respectively. In one option, one SGS driver 445 is common to the different sub-blocks in a block. In another option, separate SGS drivers are provided for each sub-block of a block. Moreover, in some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach. Or, for simplicity, the multiple SGD transistors may be connected and commonly driven, the multiple SGS transistors may be connected and commonly driven, the multiple drain side dummy memory cells may be connected and commonly driven and the multiple source side dummy memory cells may be connected and commonly driven.

The various components, including the row decoder, may receive commands from a controller such as the state machine 112 or the controller 122 to perform the functions described herein.

In one approach, the well region 433 is common to the blocks and may be driven by a voltage driver 430. A set of bit lines is also shared by the blocks. During a program operation, a BL_sel bit line voltage driver 440 provides voltages to the selected bit lines and a BL_unsel bit line voltage driver 440a provides voltages to the unselected bit lines. During a sensing operation, a BL_sense bit line voltage driver 440b provides voltages to the bit lines.

In a stacked memory device such as depicted in FIGS. 4 to 8, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach. The vertically extending NAND strings have a floating channel.

Figure 3B:
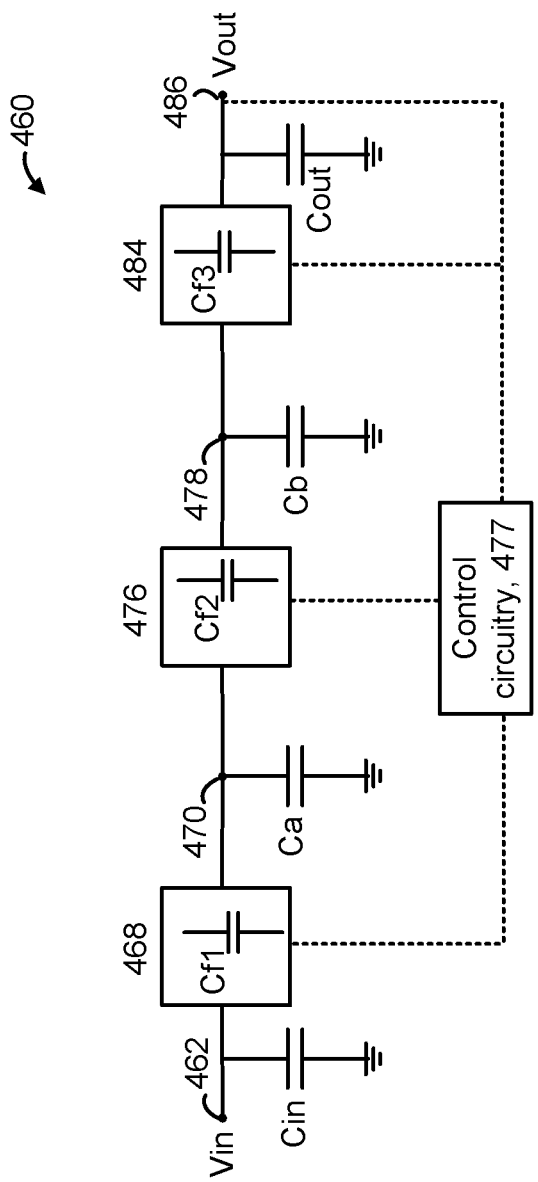
FIG. 3B depicts an example implementation of the drivers 447, 448a, 448b and 449 of FIG. 3A as a multi-stage charge pump.

FIG. 3B depicts an example implementation of the drivers 447, 448a, 448b and 449 of FIG. 3A as a multi-stage charge pump 460. A charge pump is an example of a voltage driver which can provide a higher output voltage than its input voltage. Vin is provided at input node 462 and Vout is obtained at an output node 486. For example, Vin may be a fixed power supply voltage sometimes referred to as Vdd in a semiconductor chip. Vout could be a word line voltage, for instance.

As an example, three stages 468, 476 and 484 are provided. Each stage 468, 476 and 484 can include switches and one or more flying capacitors Cf1, Cf2 and Cf3, respectively, such as a MOS (metal oxide semiconductor) capacitor. At the node 462, charge from the input voltage is maintained in an input capacitor Cin which is connected to a ground node. At a node 470 which is between the first stage 468 and the second stage 476, a capacitor Ca is connected to a ground node. At a node 478 which is between the second stage 476 and the third stage 484, a capacitor Cb is connected to a ground node. Finally, at the output node 486, an output capacitor Cout is connected to a ground node. A multi-stage charge pump can provide greater flexibility in terms of providing a high output voltage and a greater range of output voltages, compared to a single stage charge pump. Further, each stage can include one or more capacitors to provide even greater flexibility.

The multi-stage charge pump 460 is operated by control circuitry 477 which controls switching in each stage. The switches may be MOSFETs, bipolar junction transistors or relay switches, for instance.

Based on the switching, charge is transferred from the input node 462 of the first stage to Cf1, and from Cf1 to the node 470. Charge is then transferred from the node 470 of the second stage to Cf2 in the second stage, and from Cf2 to the node 478. Charge is then transferred from the node 478 to Cf3 in the third stage, and from Cf3 to the output node 486.

Generally, each stage of the charge pump operation includes two main phases: charging the flying capacitor from the input node, and discharging the flying capacitor into the output node. During each phase, some switches are closed (conductive), connecting the flying capacitor to either the input node, the output node, or a ground node. The control circuitry 477 may communicate with the output node 486 as well such as to detect its level and to make adjustments in the charge pump. For example, a switching frequency can be reduced if Vout is above a target voltage, or increased if Vout is below the target voltage. As discussed further in connection with FIGS. 3C and 3D, Vout is proportional to the switching frequency.

Note that the circuits shown are examples only, as various modifications can be made. Other types of voltage driver circuits could be used as well.

FIG. 3C depicts an example clock signal 488 and output voltage 491 of the charge pump of FIG. 3B where a normal ramp up rate is used. The clock signal is provided by the control circuitry 477 to activate switches in the stages of the charge pump. The output voltage increases with each charge period, starting from 0 V and ending at Vread, for example, e.g., 8-10 V. This may be the peak level during the discharge of the channels in a read operation, for instance, as with Vread1 and Vread2 in FIG. 12D-12F. The output voltage has a ripple shape due to the repeated charging and discharging of the capacitors in the charge pump. The clock signal has period CLK1a in a time period 489 in which the output voltage increases. The clock signal then changes to have a period CLK1b>CLK1a in a time period 490 when the output voltage reaches Vread, and the output voltage subsequently remains at Vread. The output voltage can return to 0 V or other initial level at a designated time.

FIG. 3D depicts an example clock signal 492 and output voltage 496 of the charge pump of FIG. 3B where a fast ramp up rate is used. The output voltage increases with each charge period, starting from 0 V and ending at Vread, for example. The clock signal has period CLK2<CLK1a in a time period 493 in which the output voltage increases. The clock signal then changes to have the period CLK1b>CLK2, as in FIG. 3C, in a time period 494 when the output voltage reaches Vread, and the output voltage subsequently remains at Vread.

Figure 4:
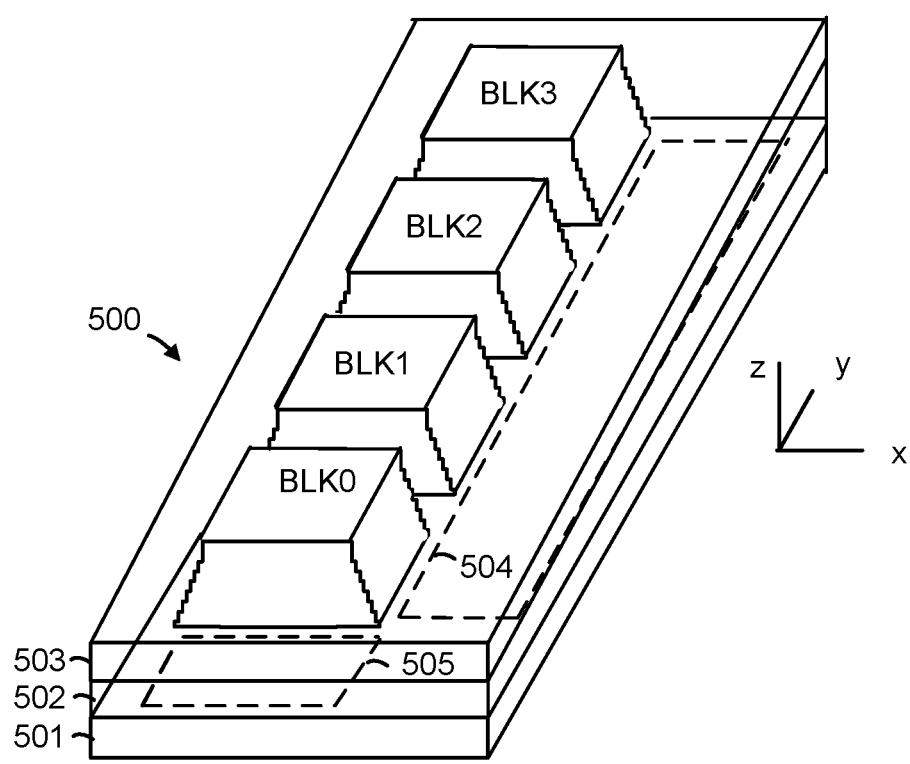
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
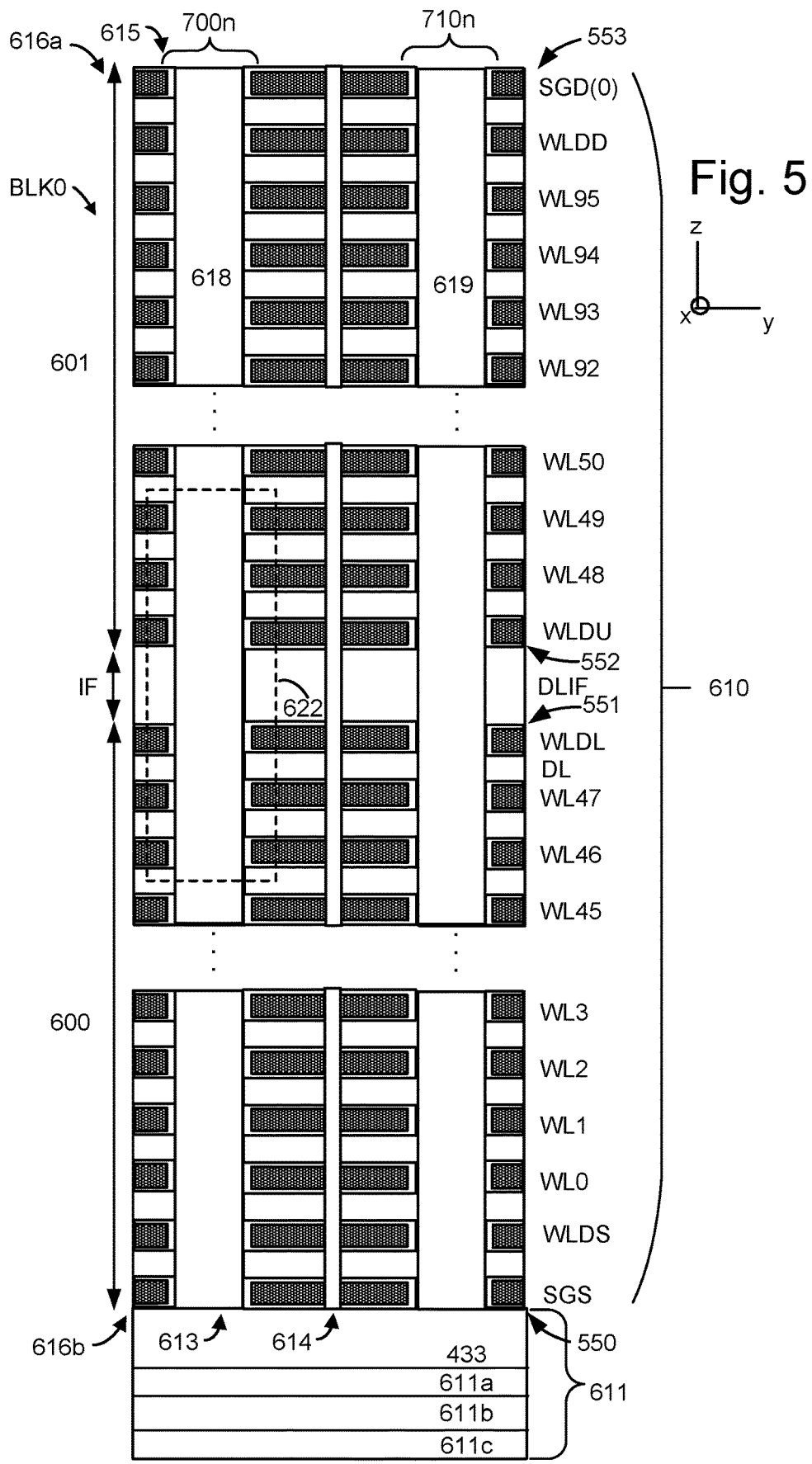
FIG. 5 depicts an example cross-sectional view of a portion of BLK0 of FIG. 4, including NAND strings 700n and 710n.

FIG. 5 depicts an example cross-sectional view of a portion of BLK0 of FIG. 4, including NAND strings 700n and 710n. The block comprises a stack 610 of alternating conductive and dielectric layers in two tiers including a lower tier 600 (e.g., a first tier or a bottom tier) and an upper tier 601 (e.g., a second tier or a top tier). The tiers are separated by an interface (IF) (or interface region or junction) which is formed of dielectric material. The conductive layers comprise SGS, WLDS, WL0-WL47, WLDL, WLDU, WL48-WL95, WLDD and SGD(0). WLDS, WLDL, WLDU and WLDD are dummy word lines or conductive layers connected to dummy memory cells which are ineligible to store user data, WL0-WL47 are data word lines or conductive layers in the lower tier connected to data memory cells which are eligible to store user data, and WL48-WL95 are data word lines in the upper tier. As an example only, the stack includes 96 data word lines, and the data word lines are evenly divided between the two tiers. DL is an example dielectric layer outside the interface, and DLIF is a dielectric layer of the interface.

A top 553 of the upper tier and the stack is depicted along with a bottom 552 of the upper tier, a top 551 of the lower tier and a bottom 550 of the lower tier and the stack.

WLDL and WLDU are examples of unselected word lines adjacent to the interface, and WL0-WL47 and WL48-WL95 are examples of unselected word lines non-adjacent to the interface in the lower and upper tiers, respectively.

The NAND strings each comprise a memory hole 618 or 619, respectively, which is filled with materials which form memory cells adjacent to the word lines. For example, see region 622 of the stack which is shown in greater detail in FIG. 6.

The stack is formed on a substrate 611. In one approach, a well region 433 (see also FIG. 3A) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits (see also FIG. 16G) may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers. See also FIG. 16G.

An insulation-filled region 614 separates the block into sub-blocks, where the NAND strings 700n and 710n are in different sub-blocks.

Figure 6:
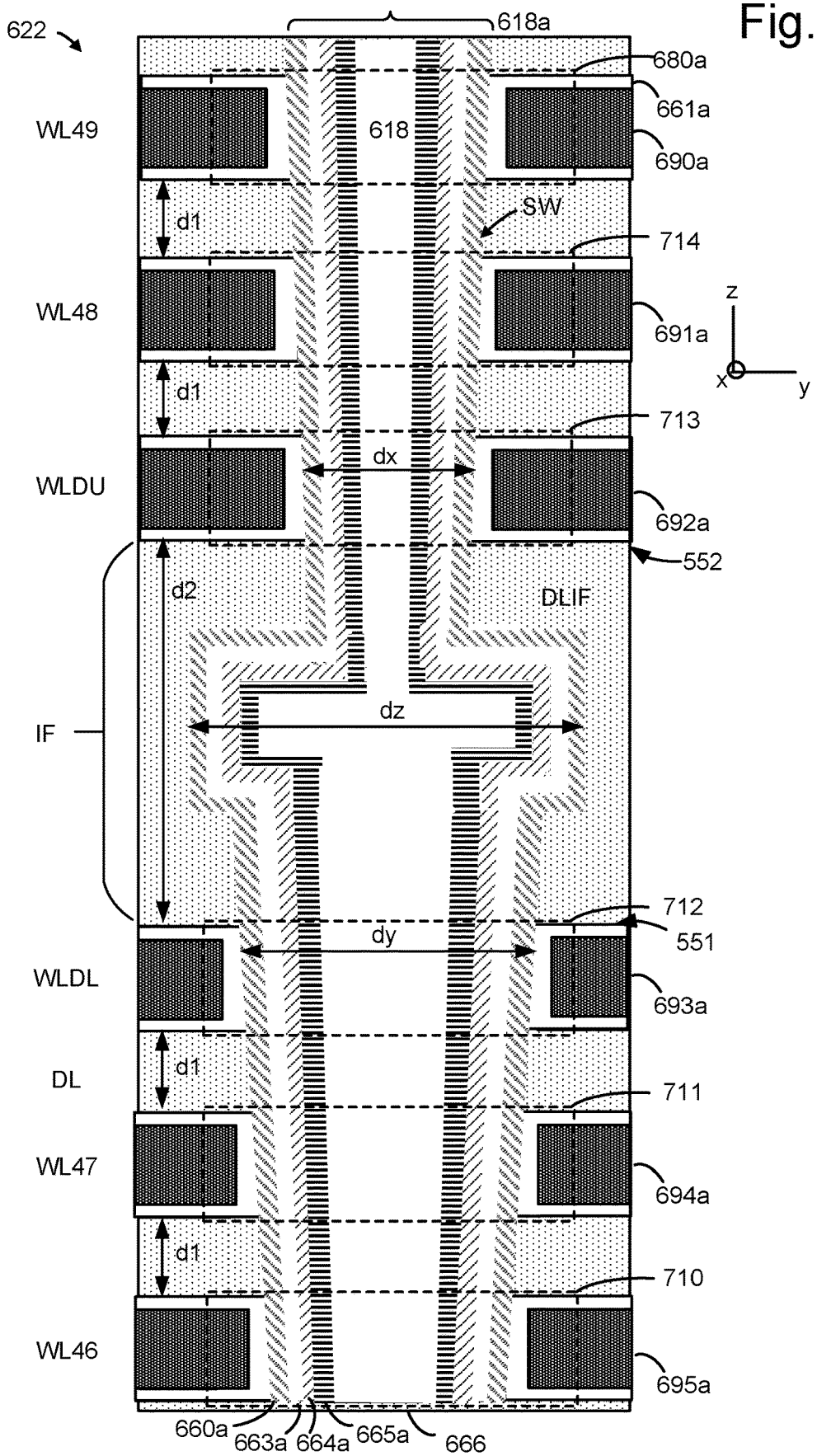
FIG. 6 depicts a close-up view of the region 622 of the stack of FIG. 5.

FIG. 6 depicts a close-up view of the region 622 of the stack of FIG. 5. The region includes the three word lines below the interface, WL46, WL47 and WLDL, and the three word lines above the interface, WLDU, WL48 and WL49. Generally, the NAND string comprises memory cells connected to respective word lines. This example includes memory cells 680a, 714, 713, 712, 711 and 710 connected to word lines WL49, WL48, WLDU, WLDL, WL47 and WL46, respectively. The word lines or word line layers are spaced apart by dielectric layers, which each have a thickness or height of d1 (a first distance) outside the interface, and by DLIF, which has a larger thickness or height of d2 (a second distance) in the interface. D1 and d2 are also inter-cell distances, or distances between adjacent memory cells along the z or vertical axis. In one approach, d2 is at least 1.5-4 times the height of d1. DLIF can be an aggregated layer which is made up of dielectric materials which are deposited in one or more separate layers on top of one another. The thickness or height of d2 of the interface is greater than a height of dielectric layers between the data memory cells.

The memory cell 713 is connected to WLDU, and is adjacent to and above the interface. The memory cell 712 is connected to WLDL, and is adjacent to and below the interface. These are interface memory cells. The second distance spans the interface. In some cases, the memory cells 713 and 712 can be set as dummy memory cells which are ineligible to store user data, due to the difficulty in controlling the channel region along the interface. WLDU and WLDL are dummy word lines in this case.

The memory hole which is etched through each tier of the stack has a tapered shape, e.g., wider at the top and narrower at the bottom. As a result, the memory hole diameter dy at the top word line layer or memory cell in the lower tier is larger than the memory hole diameter dx at the bottom word line layer or memory cell in the upper tier. A diameter dz represents a widest region of the memory hole. This widened region is used to accommodate small misalignments in the memory hole portion of the upper tier relative to the memory hole portion in the lower tier. The increased thickness d2 of DLIF is provided due to process margin concerns and also accommodates misalignment by providing a transition region between the memory hole portions in the two tiers.

The diameter of the memory hole thus changes abruptly partway along a height of the memory hole.

A number of layers or films can be deposited along the sidewall of the memory hole. The layers can conform to the changing diameter in the interface. For example, the layers can include a blocking oxide/block high-k material 660a, a charge-trapping layer 663a (e.g., silicon nitride (Si3N4) or other nitride), a tunneling layer 664a (e.g., oxide) and a channel 665a layer (e.g., polysilicon). A dielectric core 666 (e.g., silicon dioxide) fills a remainder of the memory hole. A pillar 618a or column can be formed by the materials within a memory hole as an active area of a NAND string. Referring to WL49 as an example, a word line layer can include a metal barrier 661a, and a conductive metal 662a as a control gate. For example, control gates 690a, 691a, 692a, 693a, 694a and 695a are provided. The NAND string can be considered to have a floating body channel because the length of the channel is not formed on a substrate. When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

In FIGS. 5 and 6, a NAND string 700n, 710n extends in a memory hole 618, 619, and the memory hole comprises a portion 1632 (FIG. 16C) in the lower tier and a portion 1624 in the upper tier. Also, at the interface (IF), a width dy of the portion in the lower tier is greater than a width dx of the portion in the upper tier.

FIG. 7A depicts an example view of NAND strings in sub-blocks in a 3D configuration which is consistent with the two-tier stack of FIG. 5. Each sub-block includes multiple NAND strings or other sets of memory cells connected to one another, where one example NAND string is depicted for each sub-block. The memory cells in a set may be connected to one another serially. For example, SB0, SB1, SB2 and SB3 comprise example NAND strings 700n, 710n, 720n and 730n, respectively. In this example, each NAND string has one SGD transistor, one drain-side dummy memory cell, 96 data memory cells (where 48 are above the interface IF, i.e., connected to WL48-WL95, and 48 are below the interface, i.e., connected to WL0-WL47), one source-side dummy memory cell and one SGS transistor.

In the block BLK0, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source end word line and proceeding one word line at a time to WL95, the drain end data word line.

The NAND strings 700n, 710n, 720n and 730n have channels 700a, 710a, 720a and 730a, respectively. Each channel can extend continuously from a source end select gate transistor to a drain end select gate transistor. For example, the channel 700a extends continuously in the NAND strings 700n from the SGS transistor 701 to the SGD transistor 718. The channel 700a is continuous in that it is uninterrupted and can therefore provide a continuous conductive path in the NAND string.

NAND string 700n includes SGS transistor 701, source-side dummy memory cell 702 connected to WLDS, lower tier data memory cells 703-711 connected to WL0-WL47, interface-adjacent dummy memory cells 712 and 713 connected to WLDL and WLDU, respectively, upper tier data memory cells 714, 715a, 715b, 716 connected to WL48-WL95, drain-side dummy memory cell 717 connected to WLDD, and SGD transistor 718 connected to SGD(0).

Similarly, NAND string 710n includes SGS transistor 721, source-side dummy memory cell 722 connected to WLDS, lower tier data memory cells 723-731 connected to WL0-WL47, interface-adjacent dummy memory cells 732 and 733 connected to WLDL and WLDU, respectively, upper tier data memory cells 734, 735a, 735b, 736 connected to WL48-WL95, drain-side dummy memory cell 737 connected to WLDD, and SGD transistor 738 connected to SGD(1).

NAND string 720n includes SGS transistor 741, source-side dummy memory cell 742 connected to WLDS, lower tier data memory cells 743-751 connected to WL0-WL47, interface-adjacent dummy memory cells 752 and 753 connected to WLDL and WLDU, respectively, upper tier data memory cells 754, 755a, 755b, 756 connected to WL48-WL95, drain-side dummy memory cell 757 connected to WLDD, and SGD transistor 758 connected to SGD(2).

NAND string 730n includes SGS transistor 761, source-side dummy memory cell 762 connected to WLDS, lower tier data memory cells 763-771 connected to WL0-WL47, interface-adjacent dummy memory cells 772 and 773 connected to WLDL and WLDU, respectively, upper tier data memory cells 774, 775a, 775b, 776 connected to WL48-WL95, drain-side dummy memory cell 777 connected to WLDD, and SGD transistor 778 connected to SGD(3).

In this example, the dummy memory cells 713, 733, 753 and 773 are adjacent to and above the interface, and the dummy memory cells 712, 732, 752 and 772 are adjacent to and below the interface.

A selected sub-block is a sub-block which contains the selected memory cells being read. As mentioned, for a given word line, the memory cells in one sub-block can be read in a read operation. An unselected sub-block is a sub-block which does not contains the selected memory cells being read. For example, in FIG. 7A, if SB0 is the selected sub-block, then SB1-SB3 are unselected sub-blocks. If WLn=WL_sel=WL5, memory cell 708 and other memory cells connected to WL5 in SB0 are selected memory cells. Memory cells 728, 748 and 768 and other memory cells connected to WL5 in SB1, SB2 and SB3, respectively, are examples of unselected memory cells. Also in this example, memory cells 709, 729, 749 and 769 and other memory cells connected to WLn+1=WL6 in SB0, SB1, SB2 and SB3, respectively, are examples of unselected memory cells, and memory cells 707, 727, 747 and 767 and other memory cells connected to WLn−1=WL4 in SB0, SB1, SB2 and SB3, respectively, are examples of unselected memory cells.

FIG. 7B depicts an example transistor 650 which represents any of the memory cells or select gate transistors of FIG. 7A. The transistor comprises a control gate CG, a drain D, a source S and a channel CH and may represent a memory cell or a select gate transistor, for example.

Figure 8:
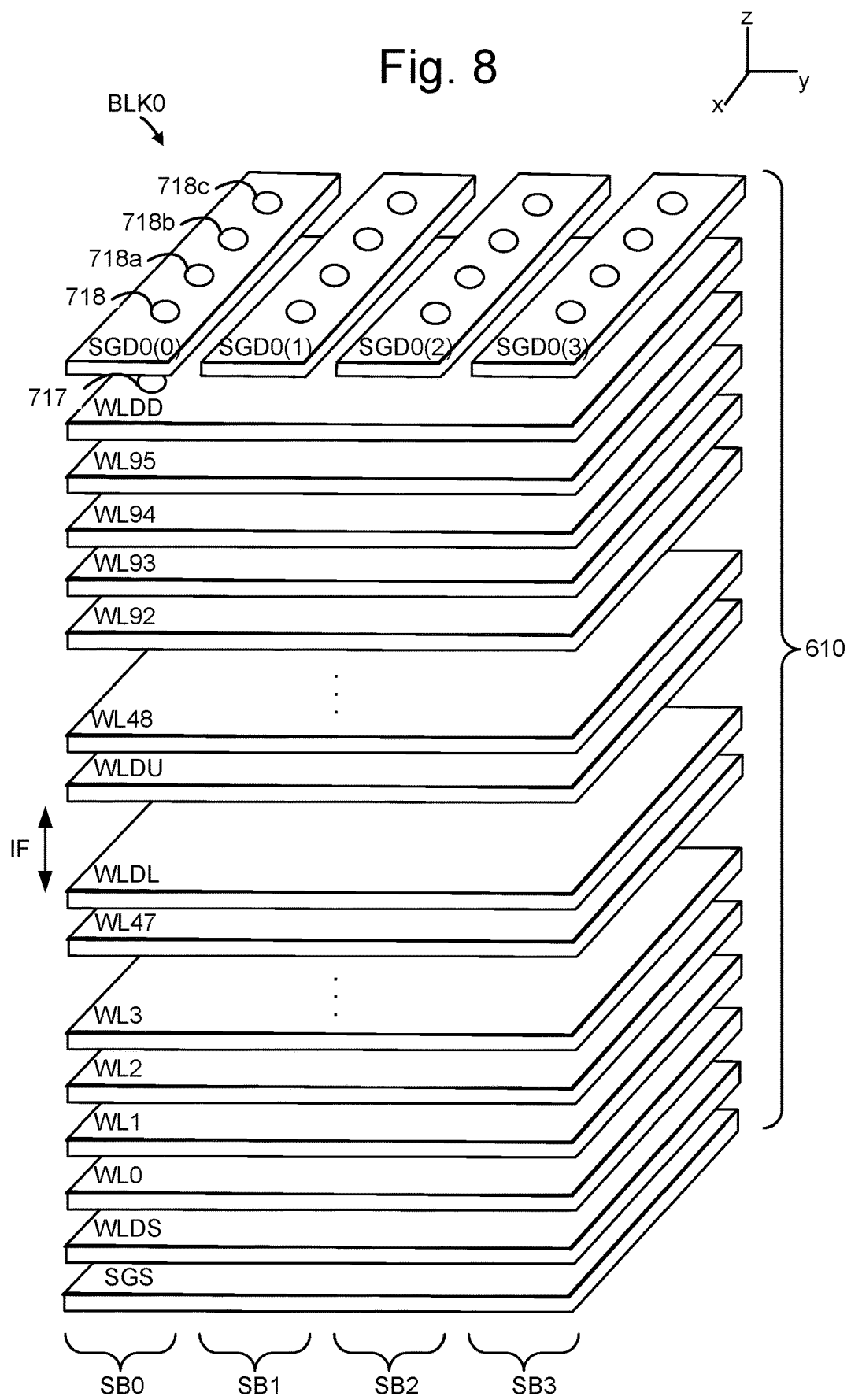
FIG. 8 depicts control gate layers in BLK0 consistent with FIG. 5-7A.

FIG. 8 depicts control gate layers in BLK0 consistent with FIG. 5-7A. The control gate layers are arranged in the stack 610 and include the layers SGS, WLDS, WL0-WL47, WLDL, WLDU, WL48-WL95, WLDD and SGD(0)-SGD (3). The SGS control gate layer is common for the block. Optionally, a separate SGS control gate layer could be provided for each sub-block. Additionally, four example memory holes are depicted in each sub-block. As mentioned, select gate transistors and memory cells can be formed along each memory hole in a NAND string. For example, SGD transistors 718, 718a, 718b and 718c are depicted in SGD0 (0), and a dummy memory cell 717 is depicted in WLDD.

Figure 9:
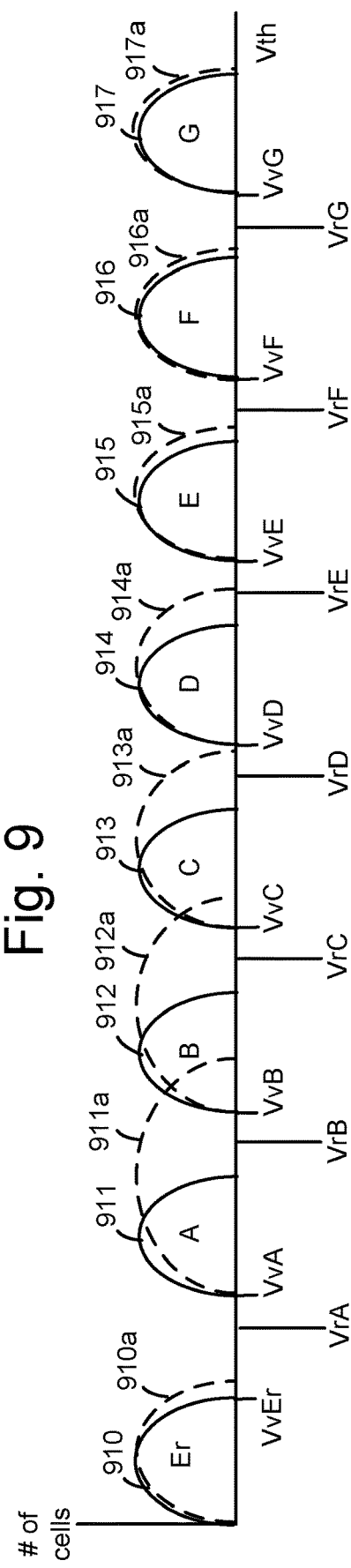
FIG. 9 depicts an example Vth distribution of a set of MLC memory cells in eight data states, with and without read disturb.

FIG. 9 depicts an example Vth distribution of a set of MLC memory cells in eight data states, with and without read disturb. The memory cells are connected to a selected word line. Verify voltages VvA, VvB, VvC, VvD, VvE, VvF and VvG are associated with the A, B, C, D, E, F and G data states, respectively. The program operation is completed when the Vth of the programmed memory cells exceeds the respective verify voltage of the assigned data state.

At a start of a program operation, the memory cells are all initially in the erased state as represented by the Vth distribution 910. After the program operation is successfully completed, the memory cells assigned to the Er state are represented by the Vth distribution 910a. The Vth distribution of the Er state is upshifted due to program disturb.

The memory cells which are programmed to the A, B, C, D, E, F and G states are represented by the Vth distributions 911, 912, 913, 914, 915, 916 and 917, respectively, immediately after programming is completed, and before read disturb. The verify voltages are used in the verify operations or tests of the memory cells. These verify voltages are also referred to as final verify voltages.

After read disturb occurs, the Vth distributions are widened and the upper tail is shifted higher, as represented by the Vth distributions 911a, 912a, 913a, 914a, 915a, 916a and 917a for the A, B, C, D, E, F and G states, respectively. Read disturb can result in read errors if the Vth of a memory cell is increased above a read voltage. For example, the upper tail of the Vth distribution 911a exceeds VrB so that the associated memory cells will be read as being in the B-state and not the A state. See also FIG. 10A-10D for further details of a read disturb mechanism. The read disturb shown represents the case with a read stress caused by hundreds of repeated read operations. The read disturb is typically larger for the lower data states than the higher data states. Read voltages VrA, VrB, VrC, VrD, VrE, VrF and VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied.

FIG. 10A depicts the NAND string 700n of FIG. 7A, where an example lower-tier word line, WL5, is selected for reading. The horizontal direction is a direction along the length of the channel of the NAND string. This may also be the vertical direction in a 3D memory structure. FIG. 10B depicts two examples of channel voltages in the NAND string of FIG. 10A. The vertical axis depicts voltage and the horizontal axis depicts a position along the NAND string of FIG. 10A.

In FIG. 10A-10D, the point in time corresponds to t6 in FIG. 12D, at the end of the channel discharge phase of the read operation. At this time, the selected word line voltage is ramped down to 0 V from Vread, for instance. The unselected word line voltages are at Vread=8 V, for example. Assume the selected memory cell 708 has been programmed to a high data state and has a Vth=5 V. When the selected word line voltage is ramped down to 0 V, a portion of the channel adjacent to the memory cell 708 will become non-conductive. A portion of the channel on the source side of the selected memory cell 708, adjacent to the memory cells 703-707, will be driven to 0 V by the source line, while the SGS transistor is in a conductive state.

A portion of the channel on the drain side of the selected memory cell 708, adjacent to the memory cells 709, . . . , 711, 712-715, 715a, . . . , 716, remains at a positive voltage because of the restricted movement of electrons through the interface. For example, the plot 1010 indicates that the channel voltage may be about 5 V in the channel portions adjacent to the memory cells 709, . . . , 711 and 712. This may be the coupled up voltage, Vwl_coupled_up, which is experienced for reasons mentioned in connected with FIG. 14A-14D. The channel voltage remains at about 5 V adjacent to the interface and then decreases at the drain side of the interface, adjacent to the memory cell 713. The channel voltage may decrease gradually toward, e.g., 0 V which is the bit line voltage at the drain end of the NAND string, in one example.

Due to the voltage difference for the channel portions adjacent to the memory cells 708 and 709, a voltage gradient is created in the channel which generates electron-hole pairs. The electron-hole pairs are generated due to grain boundaries in the polysilicon channel. The holes 1012 move toward the source line at the source end of the NAND string. The electrons 1013 move toward the bit line at the drain end of the NAND string. The electrons are attracted to, and injected into, the charge trapping layer of the memory cell 709 in particular by the relatively high control gate voltage of 8 V. This results in a Vth increase and read disturb of the memory cell 709. The read disturb is referred to as an injection type of read disturb. In general, when the selected memory cells being read (e.g., the memory cells connected to WL5 or WLn more generally) are in the lower tier, the adjacent memory cells on the drain side of the selected memory cells (e.g., the memory cells connected to WL6 or WLn+1 more generally) are most susceptible to read disturb.

With the techniques described herein, the discharging of the channels is improved such that the channel voltage is represented by the plot 1011 instead of the plot 1010. This results in a decrease in the channel gradient and the likelihood of read disturb. For example, the channel voltage might be reduced from 5 V to 3 V. Various techniques can be used to improve the discharging of the channel without extending the duration of the discharge period.

FIG. 10C depicts the NAND string 700n of FIG. 7A, where an example upper-tier word line, WL90, is selected for reading. The horizontal direction is a direction along the length of the channel of the NAND string. FIG. 10D depicts two examples of channel voltages in the NAND string of FIG. 10C. The vertical axis depicts voltage and the horizontal axis depicts a position along the NAND string of FIG. 10A.

As mentioned, when the selected word line voltage is ramped down to 0 V, a portion of the channel adjacent to the memory cell 715*b* will become non-conductive. However, one difference compared to FIG. 10B is that a portion of the channel on the drain side of the selected memory cell 715*b*, adjacent to the memory cells of WL91-WL95, will be driven to 0 V by the bit line, while the SGD transistor is in a conductive state for the selected sub-blocks.

A portion of the channel on the source side of the selected memory cell 715*b*, adjacent to the memory cells of WL0-WL89, remains at a positive voltage because of the restricted movement of electrons through the interface. For example, the plot 1020 indicates that the channel voltage may be about 5 V in the channel portions adjacent to the memory cells 713-715*a*. This may be the coupled up voltage which is experienced for reasons mentioned in connected with FIG. 14A-14D. The channel voltage remains at about 5 V adjacent to the interface and then decreases at the source side of the interface, adjacent to the memory cell 711. The channel voltage may decrease gradually toward, e.g., 0 V which is the source line voltage at the source end of the NAND string.

Due to the voltage difference for the channel portions adjacent to the memory cells 715*a* and 715*b*, a channel gradient is created which generates electron-hole pairs. The holes 1022 move toward the bit line at the drain end of the NAND string. The electrons 1023 move toward the source end of the NAND string. The electrons 1023 are attracted to, and injected into, the charge trapping layer of the memory cell 715*a* in particular by the relatively high control gate voltage of 8 V. This results in a Vth increase and read disturb of the memory cell 715*a*. In general, when the selected memory cells being read (e.g., the memory cells connected to WL90 or WLn more generally) are in the upper tier, the adjacent memory cells on the source side of the selected memory cells (e.g., the memory cells connected to WL89 or WLn–1 more generally) are most susceptible to read disturb.

With the techniques described herein, the discharging of the channels is improved such that the channel voltage is represented by the plot 1021 instead of the plot 1020. This results in a decrease in the channel gradient and the likelihood of read disturb.

FIG. 11 depicts a flowchart of an example read operation which reduces read disturb, consistent with the examples of FIG. 10A-10D. Step 1100 includes receiving a read command for NAND strings in a selected sub-block. Step 1101 includes increasing the word line and select gate voltages and grounding the drain ends and source ends of the NAND strings to discharge the channels of the NAND strings. This step can involve step 1104 which includes providing a greater ramp up rate and/or magnitude of WLDL/WLDU, the selected word line (WL_sel) and/or some unselected word lines (WL_unsel) to increase the discharge of the channels. Step 1102 includes applying control gate read voltages to a selected word line while sensing the conductive state of the selected memory cells. This involves reading selected data memory cells connected to the selected word line.

Step 1101 can be performed by a control circuit in response to the read command. This step involves discharging the channels before reading selected data memory cells in the NAND strings. The control circuit can include, e.g., the controller 122 and control circuitry 110, including the power control module 116 as detailed in FIG. 3A. The control circuit is configured to set a ramp up rate for voltages of various word lines as discussed herein.

In FIG. 12A-12F, the vertical axis denotes voltage and the horizontal axis denotes a common time axis. Also, a time period 1205 at t0-t6 represents a discharge phase of a read operation and a time period 1206 at t6-t12 represents a sensing phase of a read operation. Within the discharge phase, a discharge period t0-t5 can be defined in which the word line voltages are requested to be at a turn-on level, e.g., a level which is sufficiently high to provide the memory cells in a conductive state.

FIG. 12A depicts example voltage signals applied to select gate transistors in a read operation consistent with FIG. 11. Vsgd_sel is a voltage applied to the control gates of the SGD transistors in a selected sub-block of a read operation. This is the sub-block with the selected memory cells. Vsgd_unsel is a voltage applied to the control gates of the SGD transistors in unselected sub-blocks of a read operation. Vsgs is a voltage applied to the control gates of the SGS transistors in the block. At t0, the voltages are increased or ramped up from an initial level Vss=0 V, for instance, to a peak level such as 7 V as represented by a plot 1200, and maintained at the fixed level until t5 as represented by a plot 1201. Vsgd_sel and Vsgs continue at the fixed level until t11 (plot 1202). Vsgd_unsel decreases or is ramped down to 0 V from t5-t6 (plot 1203). The ramp up of the voltages from t0-t2 is meant to represent a normal ramp up rate, corresponding to the waveforms of FIG. 3C. A finite amount of time (t2-t0) is required to transition the voltages from an initial level to a peak level.

When the SGD voltages are at the peak level (plot 1201) in the discharge phase, the SGD transistors are in a conductive state so that the bit line voltage, e.g., 0 V, is connected to the drain end of the NAND string channel. This creates a discharge path of the channel at the drain end of the NAND string. Also, when the SGS voltages are at the peak level (plot 1201) in the discharge phase, the SGS transistors are in a conductive state so that the source line voltage, e.g., 0 V, is connected to the source end of the NAND string channel. This creates a discharge path of the channel at the source end of the NAND string.

In the reading phase, Vsgd_sel and Vsgs remain at the peak level so that sensing of the NAND strings in the selected sub-block can occur. Vsgd_unsel is set to 0 V so that the associated SGD transistors are in a non-conductive state. This prevents the unselected NAND strings from interfering with the sensing of the selected NAND strings.

FIG. 12B depicts an example voltage signal applied to a selected bit line in a read operation consistent with FIG. 11. As show by a plot 1210, from W46, the bit line voltage, Vbl, may be set to 0 V during the discharge phase to help discharge the voltage of the NAND string channels from the drain end of the NAND strings. At t6, Vbl is increased to a sensing voltage, Vbl sense (plot 1213), as discussed in connection with FIG. 2. During sensing for each read voltage, the sense node voltage of the sense circuit may remain relatively steady or may decay. If the sense node voltage decays below a specified trip voltage, the selected memory string is considered to be in a conductive state and the Vth of the selected memory cell is below the read voltage, in one embodiment. The determination of whether the sense node voltage decays below the trip voltage is made at t8 and t10 for sensing relative to VrA and VrE, respectively, in this example. If the sense node voltage does not decay below the trip voltage, the selected memory string is considered to be in a non-conductive state and the Vth of the selected memory cell is equal to or above the demarcation voltage. The bit line voltage is ramped down to Vss at t11.

FIG. 12C depicts an example voltage signal applied to a source line in a read operation consistent with FIG. 11. The source line voltage Vsl is fixed at Vss=0 V in this example. Vsl is common to all NAND strings in a block, in one approach. During the discharge phase, setting Vsl=0 V helps to discharge the voltage of the NAND string channels from the source end of the NAND strings. During the read phase, setting Vsl=0 V allows a current to flow from the drain end to the source end since Vbl sense>Vsl.

FIG. 12D depicts example voltage signals applied to a selected word line, WLn, in a read operation consistent with FIG. 11. At the start of the discharge phase, at t0, the selected word line voltage is ramped up from Vss to a peak level Vread1 or Vread2>Vread1. Additionally, two different ramp up rates are depicted. Plot 1220 represents a normal ramp up rate where the voltage is ramped up from Vss to Vread1 from t0-t3 (the ramp up rate is Vread1/(t3−t0)), or from Vss to Vread2 from t0-t4 (the ramp up rate is Vread2/(t4−t0)). Plot 1221 represents a fast ramp up rate where the voltage is ramped up from Vss to Vread1 from t0-t1 (the ramp up rate is Vread1/(t1-t0)), or from Vss to Vread2 from t0-t1a (where the ramp up rate is Vread2/(t1a−t0)). After the ramp up, the selected word line voltage is held at Vread1 (plot 1222) or Vread2 (plot 1223), then ramped back down to Vss from t5-t6. By providing the selected word line voltage at a sufficiently high level, the associated memory cells are provided in a conductive state to allow the channel to discharge in the discharge phase.

During the read phase, the selected word line voltage is increased from Vss to VrA at t7, remains at VrA until t9 (plot 1224), is increased from VrA to VrE at t9, remains at VrE until t11 (plot 1225), and is then decreased back to Vss at t11.

When the selected word line is in the lower tier, using a fast ramp up rate for the selected word line voltage increases the discharge of the NAND string channel via the source end of the NAND string, where the low-conductivity interface is not between the selected word line and the source end. When the selected word line is in the upper tier, using a fast ramp up rate for the selected word line voltage increases the discharge of the NAND string channel via the drain end of the NAND string, where the low-conductivity interface is not between the selected word line and the drain end.

FIG. 12E depicts example voltage signals applied to unselected data word lines in a read operation consistent with FIG. 11. At the start of the discharge phase, at t0, the unselected word line voltage is ramped up from Vss to a peak level Vread1 or Vread2>Vread1. Additionally, two different ramp up rates are depicted. Plot 1230 represents a normal ramp up rate where the voltage is ramped from Vss to Vread1 from t043, or from Vss to Vread2 from t0-t4. Plot 1231 represents a fast ramp up rate where the voltage is ramped up from Vss to Vread1 from t0-t1, or from Vss to Vread2 from t0-t1a. After the ramp up, the selected word line voltage is held at Vread1 (plot 1232) or Vread2 (plot 1233). If the unselected word line voltage is at Vread2 during the discharge phase, it may be ramped down to the lower peak level Vread1 for the read phase at t5, so that the unselected word lines will be at a uniform voltage of Vread1. By providing the unselected word line voltage at a sufficiently high level, the associated memory cells are provided in a conductive state to allow the channel to discharge in the discharge phase, and to allow reading to occur in the read phase.

During the read phase, the unselected word line voltage is held at Vread1 then decreased back to Vss at t11.

FIG. 12F depicts example voltage signals applied to dummy word lines in a read operation consistent with FIG. 11. At the start of the discharge phase, at t0, the dummy word line voltage is ramped up from Vss to a peak level Vread1 or Vread2. Additionally, two different ramp up rates are depicted. Plot 1240 represents a normal ramp up rate where the voltage is ramped up from Vss to Vread1 from t0-t3, or from Vss to Vread2 from t0-t4. Plot 1241 represents a fast ramp up rate where the voltage is ramped up from Vss to Vread1 from t0-t1, or from Vss to Vread2 from t0-t1a. After the ramp up, the selected word line voltage is held at Vread1 (plot 1242) or Vread2 (plot 1243). If the dummy word line voltage is at Vread2 during the discharge phase, it may be ramped down to the lower peak level Vread1 for the read phase at t5. By providing the dummy word line voltage at a sufficiently high level, the associated memory cells are provided in a conductive state to allow the channel to discharge in the discharge phase, and to allow the reading to occur in the read phase.

During the read phase, the dummy word line voltage is held at Vread1 then decreased back to Vss at t11.

The fast ramp up rate provides the associated memory cells in a conductive state for a longer period of time during the discharge phase so that the amount of discharge is increased without increasing the duration of the discharge phase. The associated memory cells enter the conductive state sooner during the discharge phase when a fast ramp up rate is used compared to a normal ramp up rate. For example, in FIG. 12F, the conductive state of WLDL/WLDU can be increased from t3-t5 to t1-t5, longer by t3−t1. The overall time of the discharge phase remains at t0-t6. The longer time of the conductive state increases the discharge flow through the interface and reduces the voltage gradient between the selected word line and the adjacent word line, as depicted in FIG. 10B, plot 1011, and FIG. 10D, plot 1021. This approach avoids increasing the overall time of the discharge phase so that the overall time for the read operation is not increased. However, there is a penalty in terms of power consumption in using a fast ramp up rate. The power consumption is based on the current consumption Icc of the memory device. By wisely choosing which word lines to use the fast ramp up rate, and by providing a separate voltage driver for these word lines, the amount of channel discharge can be optimized while the extra power consumption is minimized. Similarly, a higher than normal peak voltage (e.g., Vread2) can be used for some word line voltages in the discharge phase while a normal peak voltage (e.g., Vread1) is used for other word line voltages in the discharge phase.

Using a fast ramp up rate for the dummy word line voltage allows more electrons to move through the interface during the discharge phase. The interface is a region of reduced conductivity, as mentioned, due to its relatively large height.

Note that the two peak levels Vread1 and Vread2 are used in FIG. 12D-12F but it is possible to use different peak levels. Also, it is possible to use more than two peak levels.

FIG. 12G depicts three example options for word line voltages in the discharge phase of a read operation, consistent with FIG. 11 and FIG. 12A-12F. In a first option, WL_sel has a fast ramp up rate, WLDL/WLDU have a fast ramp up rate and WL_unsel has a normal ramp up rate. In this example, WL_unsel represents the unselected word lines in the same tier as the selected word line and in the tier which does not include the selected word line. In the example of FIG. 10A, WL_sel=WL5 and WL_unsel includes WL0-WL4, WL6-WL47 and WL48-WL95. In the example of FIG. 10C, WL_sel=WL90 and WL_unsel includes WL0-WL47, WL48 and WL50-WL95.

In options 1-3, a control circuit is configured to set a ramp up rate for a voltage of the interface-adjacent dummy memory cells which is greater than a ramp up rate of a voltage of unselected data memory cells in one of the tiers which does not include the selected data memory cells, i.e., a different tier of the stack than the tier which includes the selected data memory cells. For example, if the lower tier includes the selected data memory cells, the upper tier is the one of the tiers which does not include the selected data memory cells.

In option 1, to discharge the channels, the control circuit is configured to set the ramp up rate for the voltage of the interface-adjacent dummy memory cells to be greater than a ramp up rate of a voltage of unselected data memory cells in one of the tiers which includes the selected data memory cells.

In option 1, to discharge the channels, the control circuit is configured to set a ramp up rate of a voltage of the selected data memory cells which is greater than the ramp up rate of the voltage of the unselected data memory cells in the one of the tiers which does not include the selected data memory cells.

In option 1, to discharge the channels, the control circuit is configured to set a ramp up rate of a voltage of the selected data memory cells to be greater than a ramp up rate of a voltage of unselected data memory cells in one of the tiers which includes the selected data memory cells.

In a second option, WL_sel has a fast ramp up rate, WLDL/WLDU have a fast ramp up rate, WL_unsel between WL_sel and the IF have a fast ramp up rate, and the remaining WL_unsel have a normal ramp up rate. In the example of FIG. 10A, WL_sel=WL5, WL_unsel between WL_sel and the IF includes WL6-WL47 and the remaining WL_unsel includes WL0-WL4 and WL48-WL95. In the example of FIG. 10C, WL_sel=WL90, WL_unsel between WL_sel and the IF includes WL48 and the remaining WL_unsel includes WL0-WL47 and WL50-WL95.

In option 2, to discharge the channels, the control circuit is configured to set a ramp up rate of a voltage of unselected data memory cells which are between the selected data memory cells and the interface to be greater than the ramp up rate of the voltage of the unselected data memory cells which are in the one of the tiers which does not include the selected data memory cells.

In option 2, to discharge the channels, the control circuit is configured to set a ramp up rate of a voltage of unselected data memory cells which are between the selected data memory cells and the interface to be greater than a ramp up rate of a voltage of unselected data memory cells which are in one of the tiers which includes the selected data memory cells.

In a third option, WL_sel has a fast ramp up rate, WLDL/WLDU have a fast ramp up rate, WL_unsel in the same tier as WL_sel has a fast ramp up rate, and the remaining WL_unsel have a normal ramp up rate. In the example of FIG. 10A, WL_sel=WL5, WL_unsel in the same tier as WL_sel includes WL0-WL4 and WL6-WL47 and the remaining WL_unsel in the other tier includes WL48-WL95. In the example of FIG. 10C, WL_sel=WL90, WL_unsel in the same tier as WL_sel includes WL48-WL89 and WL91-WL95 and the remaining WL_unsel in the other tier includes WL0-WL47.

In option 3, to discharge the channels, the control circuit is configured to set a ramp up rate of a voltage of unselected data memory cells in the one of the tiers which includes the selected data memory cells to be greater than the ramp up rate of the voltage of the unselected data memory cells in the one of the tiers which does not include the selected data memory cells.

The first option is believed to provide the highest benefit-to-cost ratio in terms of the benefit of increasing channel discharge and the cost of increasing power consumption. As mentioned, the fast ramp up rate for the selected word line voltage increases the discharge of the NAND string channel via the source or drain end of the NAND string, depending on whether the selected word line is in the lower or upper tier, respectively. This option provides the fast ramp up rate for just three word lines, in one approach, so the increase in the power consumption is relatively small. For example, as in FIG. 10A, the selected word line is WL5, and the fast ramp up rate will be used for WL5, WLDL and WLDU. In one approach, the selected data WL driver 447 of FIG. 3A drives the selected word line, the first unselected data WL driver 448a drives the unselected data word lines, the second unselected data WL driver 448b is not used, and the WLDL/WLDU driver 449 drives the interface dummy word lines.

The second option provides a second highest benefit-to-cost ratio. This option increases the discharge in the channel at the selected word line, at the unselected data word lines which are between the selected word line and the interface, and at the interface. The number of word lines subject to the fast ramp up could be up to almost all of the data word lines in the tier in which the selected word line is located, in addition to the dummy interface word lines. For example, if the selected word line is WL5 as in FIG. 10A, the fast ramp up rate will be used for WL5-WL47, WLDL and WLDU. The normal ramp up rate will be used for the remaining unselected data word lines which are WL0-WL4 in the same tier as the selected word line and WL48-95 in the other tier, which does not include the selected word line. If the selected word line is WL90 as in FIG. 10C, the fast ramp up rate will be used for WLDL, WLDU and WL48-WL89. The normal ramp up rate will be used for the remaining unselected data word lines which are WL91-WL95 in the same tier as the selected word line and WL0-WL47 in the other tier, which does not include the selected word line.

Compared to option 1, option 2 increases the discharge flow between the selected word lines and the interface.

In one approach, the selected data WL driver 447 of FIG. 3A drives the selected word line, the first unselected data WL driver 448a drives the unselected data word lines between the selected word line and the interface, the second unselected data WL driver 448b drives the remaining unselected data word lines, and the WLDL/WLDU driver 449 drives the interface dummy word lines.

The third option provides a third highest benefit-to-cost ratio. This option increases the discharge in the channel at the selected word line, at the unselected data word lines which are in the same tier as the selected word line, and at the interface. The number of word lines subject to the fast ramp up is all of the data word lines in the tier in which the selected word line is located, in addition to the dummy interface word lines. For example, if the selected word line is WL5 as in FIG. 10A, the fast ramp up rate will be used for WL0-WL47, WLDL and WLDU. The normal ramp up rate will be used for the remaining unselected data word lines which are WL48-95 in the other tier, which does not include the selected word line. If the selected word line is WL90 as in FIG. 10C, the fast ramp up rate will be used for WL48-WL95, WLDL and WLDU. The normal ramp up rate will be used for the remaining unselected data word lines which are WL0-WL47 in the other tier, which does not include the selected word line.

Compared to option 2, option 3 increases the discharge flow between the selected word lines and the closest end of the NAND string, e.g., the source end or drain end if the selected word line is in the lower or upper tier, respectively. All increases in the discharge flow in the channel can help reduce read disturb.

In one approach, the selected data WL driver 447 of FIG. 3A drives the selected word line, the first unselected data WL driver 448a drives the unselected data word lines in the same tier as the selected word line, the second unselected data WL driver 448b drives the remaining unselected data word lines in the other tier which does not include the selected word line, and the WLDL/WLDU driver 449 drives the interface dummy word lines.

Figure 13A:
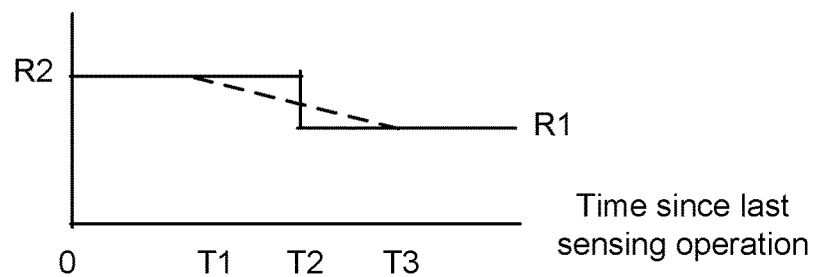
FIG. 13A depicts an example plot of a magnitude of a ramp up rate of a word line voltage in the discharge phase of a read operation versus a time since a last sensing operation.

FIG. 13A depicts an example plot of a magnitude of a ramp up rate of a word line voltage in the discharge phase of a read operation versus a time since a last sensing operation. As mentioned, and as described further in connection with FIG. 14A-14D, the channel voltage can be coupled up after a sensing operation and gradually decay over time. Accordingly, the elapsed time since the last sensing operation provides an indication of the channel voltage, where the channel voltage is greater when the time is lower. The time can be tracked using the timer 119 of FIG. 1. The benefit of the fast ramp up rate can be applied when the channel voltage is greater since there is a greater need to discharge the channel. In one approach, represented by the solid line, a higher ramp up rate R2 is used when the time is less than a threshold time T2, and a lower ramp up rate R1 is used when the time is more than T2. The higher ramp up rate R2 can correspond to the plots 1221, 1231 and 1241 in FIGS. 12D, 12E and 12F, respectively. In this case, two ramp up rates are used for simplicity.

In another approach, represented by the dashed line, many variable ramp up rates are used. R2 is used when the time is less than T1, R1 is used when the time is more than T3, and the ramp up rate decreases gradually as the time increases from T1 to T3, where T1<T2<T3.

Figure 13B:
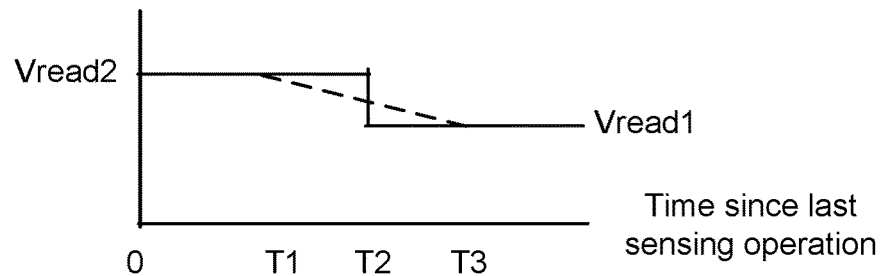
FIG. 13B depicts an example plot of a peak level of a word line voltage in the discharge phase of a read operation versus a time since a last sensing operation.

FIG. 13B depicts an example plot of a peak level of a word line voltage in the discharge phase of a read operation versus a time since a last sensing operation. An increased peak level of the word line voltage can increase channel discharge, either alone or in combination with a fast ramp up rate. In one approach, represented by the solid line, a higher peak level Vread2 is used when the time is less than a threshold time T2, and a lower peak level Vread1 is used when the time is more than T2. Examples of Vread1 and Vread2 are provided in FIG. 12D-12F. In this case, two peak levels are used for simplicity.

In another approach, represented by the dashed line, many variable peak levels are used. Vread2 is used when the time is less than T1, Vread1 is used when the time is more than T3, and the peak level decreases gradually as the time increases from T1 to T3.

Figure 13C:
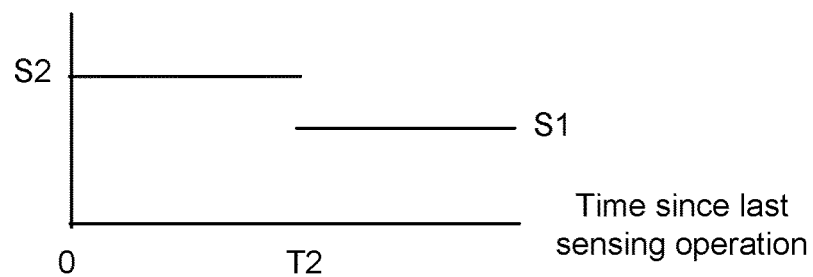
FIG. 13C depicts an example plot of a severity of a read disturb countermeasure in the discharge phase of a read operation versus a time since a last sensing operation.

FIG. 13C depicts an example plot of a severity of a read disturb countermeasure in the discharge phase of a read operation versus a time since a last sensing operation. When the time is relatively small, the countermeasure can be more severe. A more severe countermeasure means a countermeasure which results in a greater amount of channel discharge. For example, a lower severity S1 can be associated with using a fast ramp up rate and a lower peak level, while a higher severity S2 can be associated with using a fast ramp up rate and a higher peak level. Or, a lower severity S1 can be associated with using a first fast ramp up rate while a higher severity S2 can be associated with using a second fast ramp up rate which is greater than the first fast ramp up rate, and where both ramp up rates are greater than a normal ramp up rate. Other options are possible as well. In one approach, the higher severity S2 is used when the time is less than T2, and the lower severity S1 is used when the time is more than T2. More than two severity levels can be used as well.

FIG. 14A depicts a plot of example waveforms in a program operation, showing coupling up of a word line voltage. The coupling up can occur for data and dummy word lines after a sensing operation which occurs, e.g., as part of a program or read operation. The coupling up can be up to about 4 V, for instance. The coupling up occurs while the word line voltages are floating. FIGS. 14A and 14B describe the coupling up which occurs after the verify portion of a program operation and FIGS. 14C and 14D describe the coupling up which occurs after a read operation.

The time period shown represents one program-verify iteration or loop. The horizontal axis depicts time and the vertical axis depicts word line voltage, Vwl. A program voltage 1400 is applied to a selected word line from t0-t4 and reaches a magnitude of Vpgm. The program voltage can temporarily pause at an intermediate level such as Vpass to avoid a single large transition which can have undesired coupling effects. A pass voltage 1405 is applied to the unselected word lines from t0-t19 and reaches a magnitude of Vpass, which is sufficiently high to provide the memory cells in a conductive state so that the sensing (e.g., verify) operations can occur for the memory cells of the selected word line. The pass voltage includes an increasing portion, a fixed amplitude portion, for instance, at Vpass and a decreasing portion. Optionally, the pass voltage may be increased sooner relative to the program voltage so that Vpass is reached by to.

A verify voltage 1410 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG to 0 V or other steady state level from t15-t16.

For the unselected word lines, including the dummy word lines, the decrease in Vpass will cause the memory cells to transition from a conductive state to a non-conductive state. In particular, when the Vpass falls below a cutoff level, Vcutoff (the dotted line at t18), the channel of the memory cell will become cutoff, e.g., the memory cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the memory cell (the word line voltage), Vth is the threshold voltage of the memory cell and Vsl is the source line voltage which in turn is approximately the voltage at the source terminal of the memory cell. For a cell in the highest programmed state, e.g., the G state, the Vth can be as low as VvG and as high as the Vth at the upper tail of the G state in the Vth distribution 917 in FIG. 9. Vcutoff can therefore be as low as VvG+Vsl or as high as Vth of the G state upper tail+Vsl. As the pass voltage 1405 decreases from Vcutoff to 0 V, the channel is capacitively coupled down by a similar amount, as represented by plot 1415 in FIG. 14B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1412 represents one example of the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds. This example assumes the word line voltage has reached its intended minimum ramped down level of Vss=0 V, for instance. When Vwl is subsequently coupled up, it reaches a maximum level of Vwl_coupled_up and the block is in the second read situation. Vwl gradually discharges back to 0 V over a period of several minutes to return the block to the first read situation.

FIG. 14B depicts a plot of a channel voltage (Vch) corresponding to FIG. 14A. Vch for an unselected NAND string (a string not having a cell which is programmed in the current program loop), will be boosted to a level such as 8 V (not shown) during the program voltage, e.g., from W44. This boosting is achieved by providing the SGD and SGS transistors of the unselected string in a non-conductive state to cause Vch to float. Vch is coupled higher due to capacitive coupling when Vpass and Vpgm are applied to the word lines. For a selected NAND string (a string having a cell which is programmed in the current program loop), Vch is typically grounded as shown during the program voltage.

During the verify voltages, Vch may be initially at about 1 V, for instance, for a selected NAND string. Vch is about the same as Vsl for the channels of the selected NAND strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1412) are capacitively coupled higher by the increase in Vch. In one example, the voltages of the word lines float to a peak level of Vwl_coupled_up (plot 1412), e.g., about 4 V. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1−6×0.9=−4.4 V, for instance. Accordingly, as Vch returns to 0 V, there is a 4.4 V increase in Vch which is coupled to the word line, e.g., control gate, of the memory cells. By applying the 90% coupling ratio to this coupling up, Vwl_coupled_up may be about 4.4×0.9=4 V. The voltages of the word lines are floated by disconnecting the word lines from a word line driver.

The channel voltage of plot 1415 correspond to the word line voltages of plots 1412 after t19.

FIG. 14C depicts a plot of example waveforms in a read operation, showing coupling up of a word line voltage. A read operation is similar to a verify operation as both are sensing operations and both can provide a coupling up of the word line voltages. The horizontal axis depicts time and the vertical axis depicts word line voltage, Vwl. Pass voltages of plots 1430, 1431 and 1432 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1420 (at levels of VrA and VrE), 1421 (at levels of VrB, VrD and VrF) and 1422 (at levels of VrC and VrG) for each of the lower, middle and upper pages, respectively, consistent with FIG. 10. The read voltages are applied to the selected word line. An eight-level memory device is used in this example.

For the unselected word lines, the decrease in Vpass will cause the memory cells to transition from a conductive state to a non-conductive state, as discussed. The dotted line at t13 indicates when a G state cell becomes non-conductive. As the pass voltage of plot 1432 decreases from Vcutoff to 0 V, the channel is capacitively coupled down by a similar amount, as represented by the plot 1435 in FIG. 14D. As the channel voltage increases after t14, the word line voltages are floated and are coupled higher, to Vwl_coupled_up.

FIG. 14D depicts a plot of a channel voltage (Vch) corresponding to FIG. 14C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1432) are capacitively coupled higher by the increase in Vch (plot 1435). The voltages of the word lines float to a peak level of Vwl_coupled_up, as discussed in connection with FIG. 14B.

Figure 15:
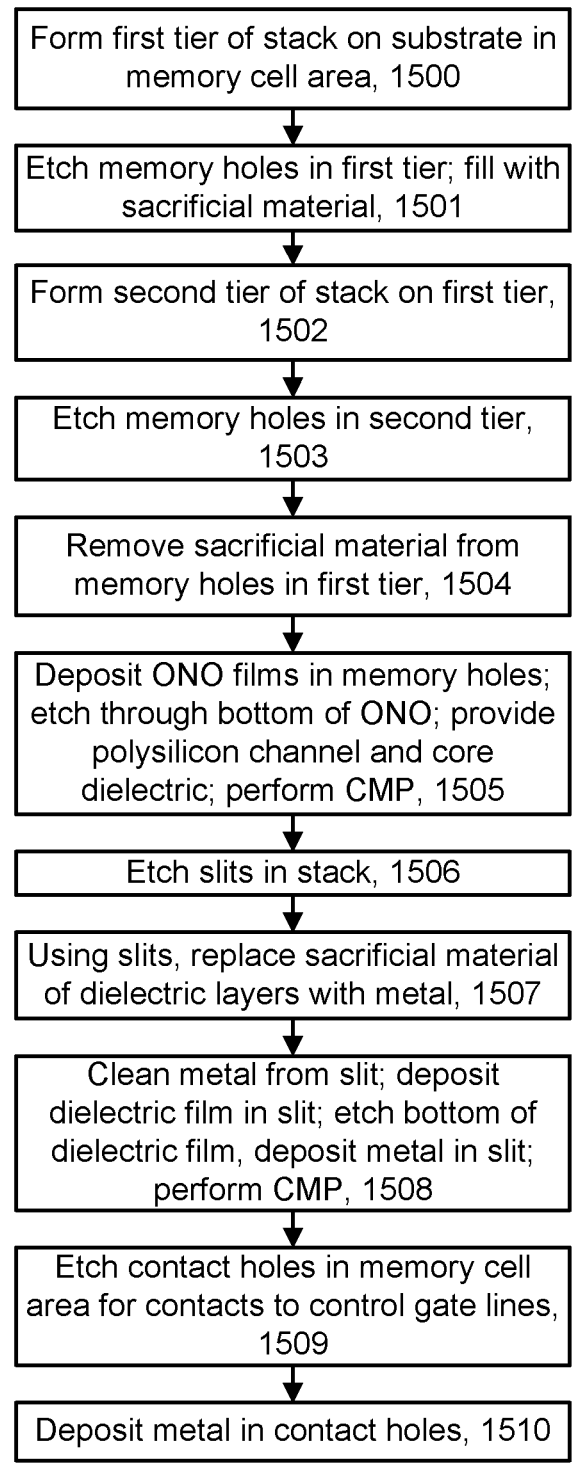
FIG. 15 depicts an example fabrication process for a semiconductor stack comprising two tiers, consistent with FIG. 5-8.

FIG. 15 depicts an example fabrication process for a semiconductor stack comprising two tiers, consistent with FIG. 5-8. The process can be extended to form more than two tiers. Step 1500 includes forming a lower tier of a stack on a substrate in a memory cell area. Step 1501 includes etching memory holes in the lower tier, and filling the memory holes with a sacrificial material, such as SiN. See, e.g., FIG. 16A.

Step 1502 includes forming an upper tier of the stack on the lower tier. Step 1503 includes etching memory holes in the upper tier. See, e.g., FIG. 16B. Step 1504 includes removing the sacrificial material from the memory holes in the lower tier, e.g., using a wet etch. See, e.g., FIG. 16C.

Step 1505 includes depositing oxide-nitride oxide (ONO) films in the memory holes. See, e.g., FIG. 16D. Step 1506 includes etching slits in the stack. See, e.g., FIG. 16E. Step 1507 includes using the slits to replace the sacrificial material of the dielectric layers of the stack with metal. This can involve providing an etchant via the slit which removes the sacrificial material, creating voids, then providing metal via the slit which fills the voids.

Step 1508 includes cleaning metal from the slit, depositing a dielectric film in the slit which coast the walls of the slit, etching a bottom of the dielectric film, depositing metal in the slit, and performing CMP to remove excess metal. This step can provide a conductive metal path in the slit from a top of the stack to the substrate, to connect to circuitry below the stack. See, e.g., FIG. 16F.

Step 1509 includes etching contact holes in the memory cell area for contacts to the control gate lines. See, e.g., FIG. 16G. Step 1510 includes depositing metal in the contact holes. See, e.g., FIG. 16G.

Note that some of the steps can be performed in a different order than the order shown in FIG. 15.

FIG. 16A depicts a semiconductor structure 1600 in a configuration which is consistent with steps 1500 and 1501 of FIG. 15. The structure includes a memory cell area of a substrate 1601. A peripheral area, not shown, may also be fabricated at the same time. The substrate comprises an intrinsic silicon region 1602, a deep n-well 1603 and a p-well 1604, for instance. A lower tier 1605 of a stack includes alternating dielectric layers and control gate layers. The control gate layers may comprise a sacrificial material at this stage of the fabrication. An example dielectric layer 1606 and an example control gate layer 1607 are depicted. This example includes nine control gate layers in the tier. A dielectric layer 1608 extends on top of the stack while a dielectric layer 1609 extends on top of the semiconductor structure. The dielectric layer 1608 may be, e.g., SiOx deposited by LPCVD or PECVD, for instance. The dielectric layer 1609 may be, e.g., SiN deposited by low pressure chemical vapor deposition (LPCVD) or plasma-enhanced chemical vapor deposition (PECVD), for instance.

The semiconductor structure includes a plurality of memory holes which are etched in the tier. An example memory hole 1610 (also referred to as a column or pillar when the memory hole is filled) includes a widened top portion 1611 above an elongated portion 1612. A source side region 1613 is below the memory hole. A top 1614 and a bottom 1615 of the stack are also depicted. A coordinate system shows x, y and z (vertical) directions.

FIG. 16B depicts a semiconductor structure 1620 in a configuration which is consistent with steps 1502 and 1503 of FIG. 15. A second (top) tier 1616 of the stack is formed on the lower tier and also includes alternating dielectric layers and control gate layers. An interface IF at the top of the lower tier separates the upper and lower tiers. An example dielectric layer 1621 and an example control gate layer 1622 are depicted. This example includes nine control gate layers in the tier. A dielectric layer 1623 extends on top of the semiconductor structure 1620 which comprises a stack 1626 of alternating dielectric layers and control gate layers.

Memory holes, including an example memory hole 1624 are etched in the upper tier of the stack. These memory holes are aligned with the sacrificial material in the memory holes in the lower tier (e.g., example sacrificial material 1625). In some cases there is a misalignment between the memory holes in the upper and lower tiers. The widened top portion 1611 provides an increased area for the memory hole in the upper tier to contact, to ensure that the memory holes are connected to provide a continuous memory hole through both tiers.

Figure 16C:
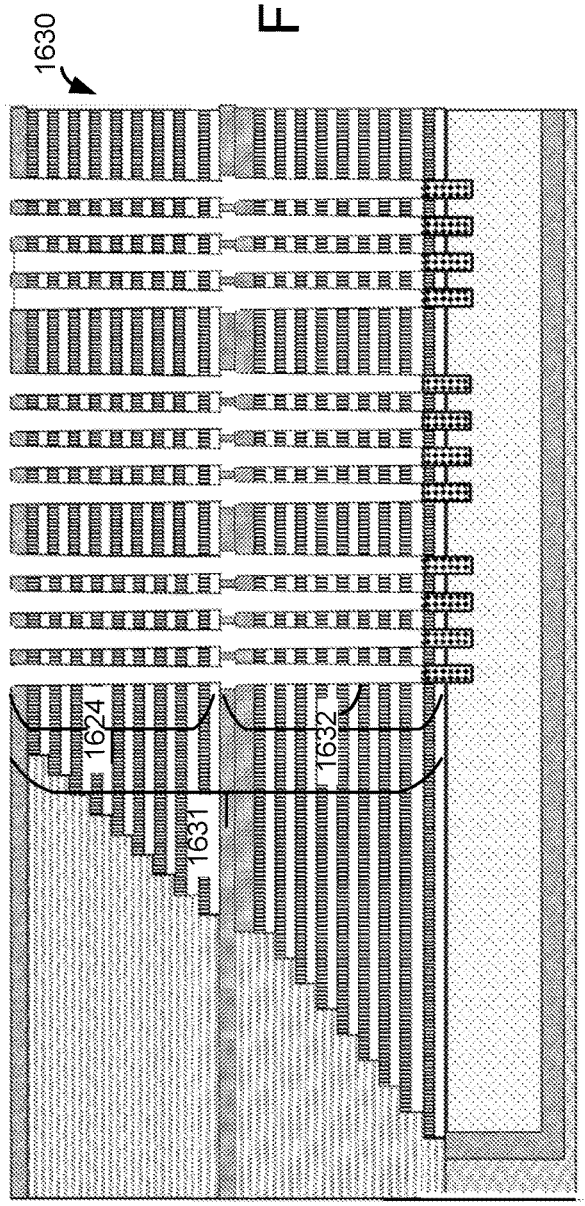
FIG. 16C depicts a semiconductor structure in a configuration which is consistent with step 1504 of FIG. 15.

FIG. 16C depicts a semiconductor structure 1630 in a configuration which is consistent with step 1504 of FIG. 15. Once the sacrificial material in the lower tier is removed, continuous memory holes, such as an example continuous memory hole 1631, are formed which extend through both tiers, from the top of the stack to the bottom of the stack. The continuous memory hole 1631 comprises the memory hole portion 1632 of the lower tier and the memory hole portion 1624 of the upper tier.

Figure 16D:
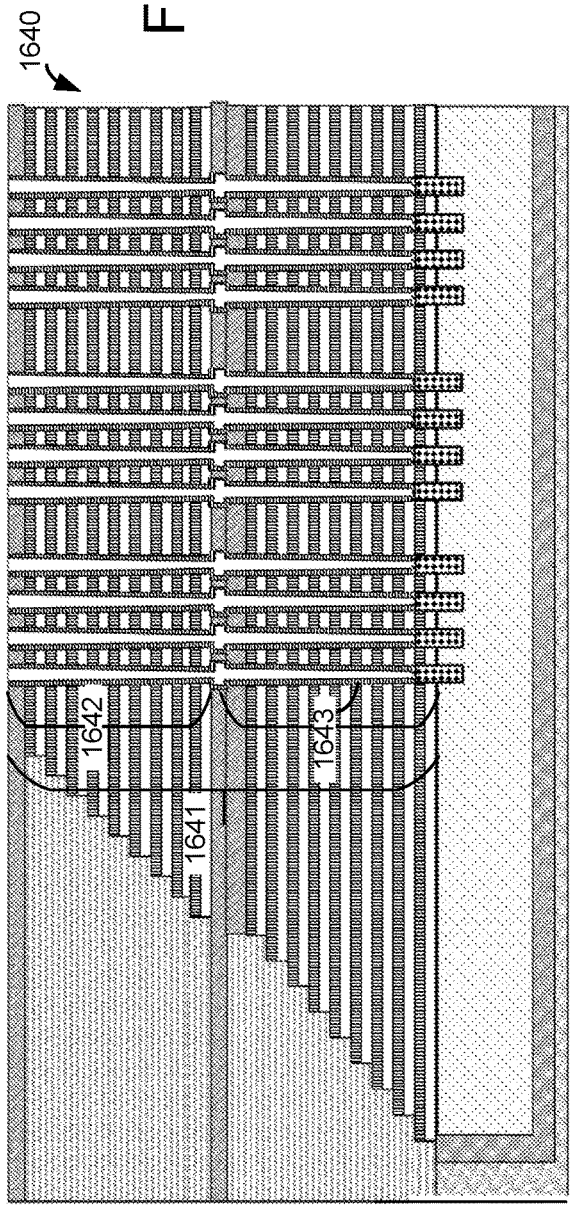
FIG. 16D depicts a semiconductor structure in a configuration which is consistent with step 1505 of FIG. 15.

FIG. 16D depicts a semiconductor structure 1640 in a configuration which is consistent with step 1505 of FIG. 15. The memory holes are filled with materials such as ONO films, a polysilicon channel and a core dielectric. To provide the polysilicon channel, amorphous silicon may be deposited follow by a heating step. This results in a column 1641 (e.g., pillar) comprising a column 1642 in the upper tier above a column 1643 in the lower tier.

FIG. 16E depicts a semiconductor structure 1650 in a configuration which is consistent with step 1506 of FIG. 15. Slits, including an example slit 1651, are formed periodically in the y direction in the stack. Each slit may have a uniform cross-section in the y-z plane and extend across the stack in the x direction.

FIG. 16F depicts a semiconductor structure 1660 in a configuration which is consistent with steps 1507 and 1508 of FIG. 15. By providing an etchant in the slits, the sacrificial material of the control gate layers is removed. Voids created in the control gate layers are subsequently filled with a metal such as tungsten. For example, a metal (e.g., conductive layer) is provided for the control gate layer 1622. A metal residual is then removed from the slits and a dielectric film 1663 is deposited in the slits, leaving a void in the slit. The void may extend from the p-well at a bottom of the stack to the top of the stack. The slit may be filled with a metal 1672 which provides a metal interconnect to the substrate.

Figure 16G:
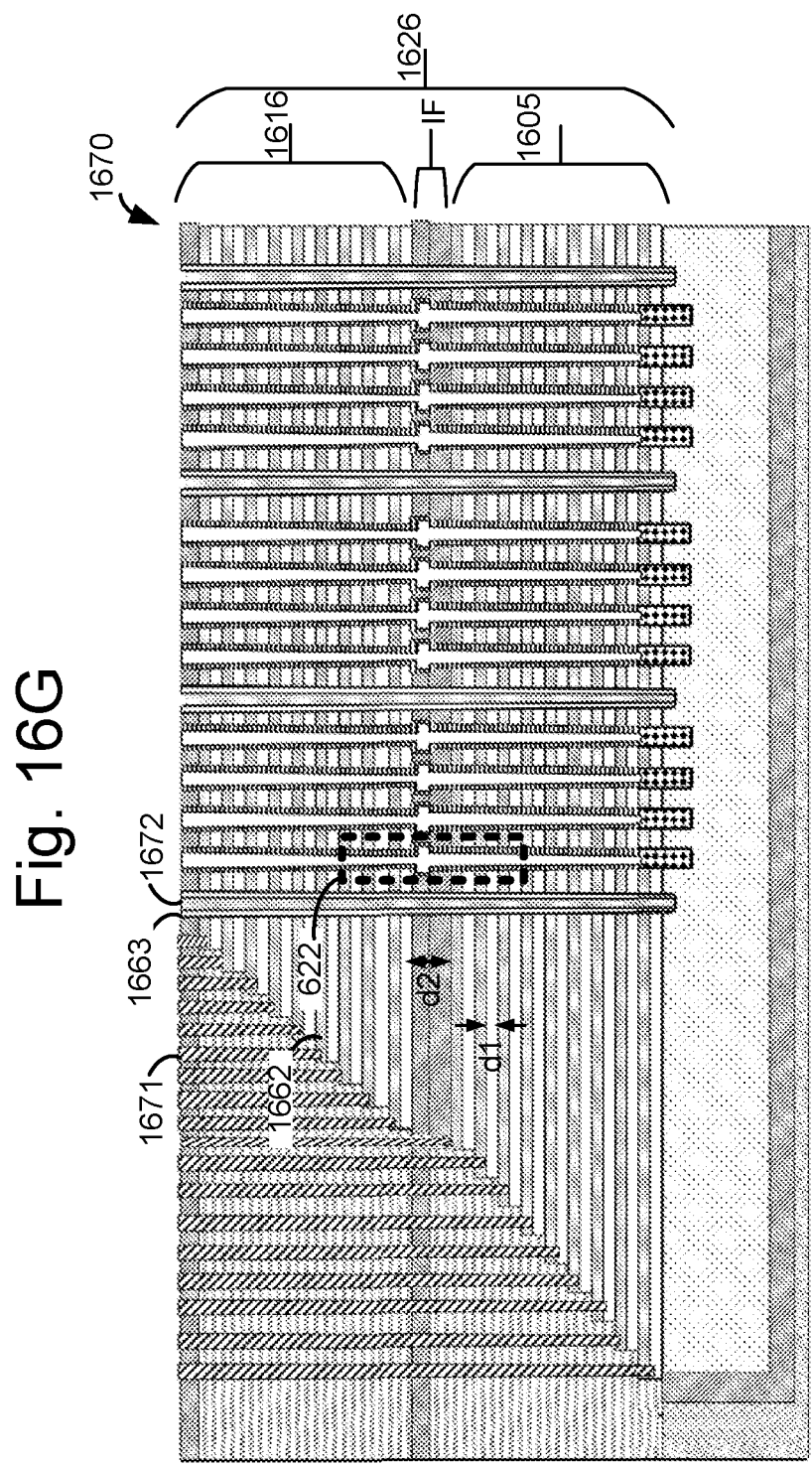
FIG. 16G depicts a semiconductor structure in a configuration which is consistent with steps 1509 and 1510 of FIG. 15.

FIG. 16G depicts a semiconductor structure 1670 in a configuration which is consistent with steps 1509 and 1510 of FIG. 15. Contacts holes are etched in the stack outside the area with the memory holes to provide voids which extend upward from terraced edges of control gate layers to the top of the stack. The contact holes are then filled with metal to provide metal vias which connect the control gate layers to the top of the stack. Subsequent processing involves connected metal paths above the stack to the contacts. The metal paths may in turn be connected to voltage sources, for example, or other circuitry. An example via 1671 is connected to the control gate layer 1662. The distances d1 and d2 between memory cells, discussed previously, are also depicted. See FIG. 6 for a close-up view of the region 622 of the stack.

The semiconductor structure is an example of a three-dimensional structure in which memory cells are arranged in NAND strings.

The stack comprises a plurality of alternating conductive and dielectric layers. The conductive layers are connected to control gates of memory cells and other transistors such as SGD and SGS transistors in each NAND string. In one approach, the conductive layers and associated memory cells in the upper and lower tiers are separate by a distance d1. The conductive layers and associated memory cells which are adjacent to the interface may be separate from one another by a larger distance d2.

In one implementation, an apparatus comprises: a set of NAND strings, the set of NAND strings extends in a lower tier and an upper tier of a stack, the lower tier separated from the upper tier by an interface, each NAND string comprising a channel, dummy memory cells adjacent to the interface on opposing sides of the interface and data memory cells; and a control circuit configured to, in response to a read command, discharge the channels before reading selected data memory cells in the NAND strings, wherein to discharge the channels, the control circuit is configured to set a ramp up rate for a voltage of the dummy memory cells which is greater than a ramp up rate of a voltage of unselected data memory cells in one of the tiers which does not include the selected data memory cells.

In another implementation, a method comprises: in response to a read command involving a set of NAND strings, discharging channels of the NAND strings, wherein the set of NAND strings extends in multiple tiers of a stack, the multiple tiers comprises a lower tier separated from an upper tier by an interface; and after the discharging of the channels, reading selected data memory cells of the NAND strings. The discharging of the channels comprises: increasing a voltage of the selected data memory cells to provide the selected data memory cells in a conductive state; increasing a voltage of unselected data memory cells of the set of NAND strings between the selected data memory cells and the interface to provide the unselected data memory cells between the selected data memory cells and the interface in a conductive state; increasing a voltage of unselected data memory cells of the set of NAND strings in a different tier than the selected data memory cells to provide the unselected data memory cells in the different tier than the selected data memory cells in a conductive state; and increasing a voltage of dummy memory cells of the set of NAND strings adjacent to the interface to provide the dummy memory cells in a conductive state, and wherein a rate of the increasing of the voltage of the dummy memory cells is greater than a rate of the increasing of the voltage of the unselected data memory cells in the different tier than the selected data memory cells.

In another implementation, an apparatus comprises: a set of NAND strings, the set of NAND strings extends in a lower tier and an upper tier of a stack, the lower tier separated from the upper tier by an interface, each NAND string comprising a channel, dummy memory cells adjacent to the interface on opposing sides of the interface and data memory cells; and a control circuit configured to, in response to a read command, discharge the channels before reading selected data memory cells in the NAND strings, wherein to discharge the channels, the control circuit is configured to increase a voltage of the dummy memory cells to a first peak level and to increase a voltage of unselected data memory cells in one of the tiers which does not include the selected data memory cells to a second peak level which is less than the first peak level.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
 a set of NAND strings, the set of NAND strings extends in a lower tier and an upper tier of a stack, the lower tier separated from the upper tier by an interface, each NAND string comprising a drain end, a source end, a channel, dummy memory cells adjacent to the interface on opposing sides of the interface and data memory cells; and
 a control circuit configured to, in response to a read command, discharge the channels before reading selected data memory cells in the NAND strings, wherein to discharge the channels, the control circuit is configured to increase a voltage of the dummy memory cells from an initial level to a peak level at a ramp up rate and increase a voltage of unselected data memory cells from an initial level to a peak level at a ramp up rate while grounding the drain ends and the source ends of the NAND strings, the ramp up rate of the voltage of the dummy memory cells is greater than the ramp up rate of the voltage of the unselected data memory cells, and the unselected data memory cells are in one of the tiers which does not include the selected data memory cells.

2. The apparatus of claim 1, wherein:
 to discharge the channels, the control circuit is configured to set the ramp up rate for the voltage of the dummy memory cells to be greater than a ramp up rate of a voltage of unselected data memory cells in one of the tiers which includes the selected data memory cells.

3. The apparatus of claim 1, wherein:
 to discharge the channels, the control circuit is configured to set a ramp up rate of a voltage of the selected data memory cells which is greater than the ramp up rate of the voltage of the unselected data memory cells in the one of the tiers which does not include the selected data memory cells.

4. The apparatus of claim 1, wherein:
 to discharge the channels, the control circuit is configured to set a ramp up rate of a voltage of the selected data memory cells to be greater than a ramp up rate of a voltage of unselected data memory cells in one of the tiers which includes the selected data memory cells.

5. The apparatus of claim 1, wherein:
 to discharge the channels, the control circuit is configured to set a ramp up rate of a voltage of unselected data memory cells which are between the selected data memory cells and the interface to be greater than the ramp up rate of the voltage of the unselected data memory cells which are in the one of the tiers which does not include the selected data memory cells.

6. The apparatus of claim 1, wherein:
 to discharge the channels, the control circuit is configured to set a ramp up rate of a voltage of unselected data memory cells which are between the selected data memory cells and the interface to be greater than a ramp up rate of a voltage of unselected data memory cells which are in one of the tiers which includes the selected data memory cells.

7. The apparatus of claim 1, wherein:
 to discharge the channels, the control circuit is configured to set a ramp up rate of a voltage of unselected data memory cells in the one of the tiers which includes the selected data memory cells to be greater than the ramp up rate of the voltage of the unselected data memory cells in the one of the tiers which does not include the selected data memory cells.

8. The apparatus of claim 1, further comprising:
 a timer configured to track a time period since a last operation of the set of NAND strings, wherein to discharge the channels, the control circuit is configured to set the ramp up rate for the voltage of the dummy memory cells to be greater when the time period is below a threshold than when the time period is above the threshold.

9. The apparatus of claim 1, further comprising:
 a timer configured to track a time period since a last operation of the set of NAND strings, wherein to discharge the channels, the control circuit is configured to increase the voltage of the dummy memory cells to a peak level which is greater when the time period is below a threshold than when the time period is above the threshold.

10. The apparatus of claim 1, wherein:
 to discharge the channels, the control circuit is configured to increase the voltage of the dummy memory cells to a first level, and to read the selected data memory cells, the control circuit is configured to set the voltage of the dummy memory cells at a second level which is less than the first level.

11. The apparatus of claim 1, wherein:
 to discharge the channels, the control circuit is configured to increase the voltage of the dummy memory cells to a first peak level and to increase the voltage of the unselected data memory cells in the one of the tiers which does not include the selected data memory cells to a second peak level which is less than the first peak level.

12. The apparatus of claim 1, wherein:
 to discharge the channels, the control circuit is configured to increase a voltage of the selected data memory cells to a first peak level and to increase the voltage of the unselected data memory cells in the one of the tiers which does not include the selected data memory cells to a second peak level which is less than the first peak level.

13. The apparatus of claim 1, wherein:
a height of the interface is greater than a height of dielectric layers between the data memory cells.

14. A method, comprising:
in response to a read command involving a set of NAND strings, discharging channels of the NAND strings, wherein the set of NAND strings extends in multiple tiers of a stack, the multiple tiers comprise a lower tier separated from an upper tier by an interface; and
after the discharging of the channels, reading selected data memory cells of the NAND strings, wherein the discharging of the channels comprises:
increasing a voltage of the selected data memory cells to provide the selected data memory cells in a conductive state;
increasing a voltage of unselected data memory cells of the set of NAND strings between the selected data memory cells and the interface to provide the unselected data memory cells between the selected data memory cells and the interface in a conductive state;
increasing a voltage of unselected data memory cells of the set of NAND strings in a different tier than the selected data memory cells to provide the unselected data memory cells in the different tier than the selected data memory cells in a conductive state; and
increasing a voltage of dummy memory cells of the set of NAND strings adjacent to the interface to provide the dummy memory cells in a conductive state, and wherein a rate of the increasing of the voltage of the dummy memory cells is greater than a rate of the increasing of the voltage of the unselected data memory cells in the different tier than the selected data memory cells.

15. The method of claim 14, wherein:
the rate of the increasing of the voltage of the selected data memory cells is greater than the rate of the increasing of the voltage of the unselected data memory cells in the different tier than the selected data memory cells.

16. The method of claim 14, wherein:
the rate of the increasing of the voltage of the unselected data memory cells between the selected data memory cells and the interface is greater than the rate of the increasing of the voltage of the unselected data memory cells in the different tier than the selected data memory cells.

17. The method of claim 14, wherein:
the discharging of the channels comprises increasing a voltage of unselected data memory cells of the set of NAND strings between the selected data memory cells and a source end of the set of NAND strings to provide the unselected data memory cells between the selected data memory cells and the source end of the set of NAND strings in a conductive state; and
the rate of the increasing of the voltage of the unselected data memory cells between the selected data memory cells and the source end of the set of NAND strings is greater than the rate of the increasing of the voltage of the unselected data memory cells in the different tier than the selected data memory cells.

18. An apparatus, comprising:
a set of NAND strings, the set of NAND strings extends in a lower tier and an upper tier of a stack, the lower tier separated from the upper tier by an interface, each NAND string comprising a drain end, a source end, a channel, dummy memory cells adjacent to the interface on opposing sides of the interface and data memory cells; and
a control circuit configured to, in response to a read command, discharge the channels before reading selected data memory cells in the NAND strings, wherein to discharge the channels, the control circuit is configured to increase a voltage of the dummy memory cells to a first peak level and to increase a voltage of unselected data memory cells in one of the tiers which does not include the selected data memory cells to a second peak level which is less than the first peak level while grounding the drain ends and the source ends of the NAND strings.

19. The apparatus of claim 18, wherein:
to discharge the channels, the control circuit is configured to increase a voltage of the selected data memory cells to a peak level which is higher than the second peak level.

20. The apparatus of claim 18, wherein:
to read the selected data memory cells, the control circuit is configured to set the voltage of the dummy memory cells at a level which is less than the first peak level.

* * * * *